United States Patent
Tyagi et al.

(10) Patent No.: US 11,584,885 B2
(45) Date of Patent: *Feb. 21, 2023

(54) CODOPING METHOD FOR MODIFYING THE SCINTILLATION AND OPTICAL PROPERTIES OF GARNET-TYPE SCINTILLATORS

(71) Applicant: University of Tennessee Research Foundation, Knoxville, TN (US)

(72) Inventors: Mohit Tyagi, Mumbai (IN); Merry Koschan, Knoxville, TN (US); Charles L. Melcher, Oak Ridge, TN (US); Samuel Bradley Donnald, Millington, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 412 days.

This patent is subject to a terminal disclaimer.

(21) Appl. No.: 14/762,845

(22) PCT Filed: Jan. 23, 2014

(86) PCT No.: PCT/US2014/012799
§ 371 (c)(1),
(2) Date: Jul. 23, 2015

(87) PCT Pub. No.: WO2014/171985
PCT Pub. Date: Oct. 23, 2014

(65) Prior Publication Data
US 2015/0353822 A1     Dec. 10, 2015

Related U.S. Application Data

(60) Provisional application No. 61/755,799, filed on Jan. 23, 2013.

(51) Int. Cl.
*C09K 11/77* (2006.01)
*C30B 15/04* (2006.01)
(Continued)

(52) U.S. Cl.
CPC ...... *C09K 11/7706* (2013.01); *C09K 11/7774* (2013.01); *C30B 15/04* (2013.01);
(Continued)

(58) Field of Classification Search
CPC . C09K 11/7706; C09K 11/7774; C30B 29/28; C30B 15/04; G01T 1/2023; G21K 2004/06
See application file for complete search history.

(56) References Cited

U.S. PATENT DOCUMENTS 4,199,396 A   4/1980  Brandie et al.
4,302,280 A   11/1981  Bruni
(Continued)

FOREIGN PATENT DOCUMENTS

EP   1043383 B2   5/2007
EP   2 671 940    12/2013
(Continued)

OTHER PUBLICATIONS

Sobon et al. Growth and Properties of Lanthanum Oxysulfide Crystals, Journal of Applied Physics vol. 42, No. 8 (Jul. 1971), pp. 3049-3053.*
(Continued)

*Primary Examiner* — Hugh Maupin
(74) *Attorney, Agent, or Firm* — Jenkins, Wilson, Taylor & Hunt, P.A.

(57) ABSTRACT

A method of tailoring the properties of garnet-type scintillators to meet the particular needs of different applications is described. More particularly, codoping scintillators, such as $Gd_3Ga_3Al_2O_{12}$, $Gd_3Ga_2Al_3O_{12}$, or other rare earth gallium
(Continued)

aluminum garnets, with different ions can modify the scintillation light yield, decay time, rise time, energy resolution, proportionality, and/or sensitivity to light exposure. Also provided are the codoped garnet-type scintillators themselves, radiation detectors and related devices comprising the codoped garnet-type scintillators, and methods of using the radiation detectors to detect gamma rays, X-rays, cosmic rays, and particles having an energy of 1 keV or greater.

23 Claims, 22 Drawing Sheets

(51) Int. Cl.
    *C30B 29/28* (2006.01)
    *G01T 1/202* (2006.01)
    *G21K 4/00* (2006.01)
(52) U.S. Cl.
    CPC ............ *C30B 29/28* (2013.01); *G01T 1/2023* (2013.01); *G21K 2004/06* (2013.01)

(56) References Cited

U.S. PATENT DOCUMENTS

| | | | |
|---|---|---|---|
| 4,958,080 A | 9/1990 | Melcher | |
| 5,517,034 A * | 5/1996 | Neyens | C09K 11/7733 250/484.4 |
| 6,458,295 B1 * | 10/2002 | Yamada | C09K 11/7774 250/361 R |
| 6,793,848 B2 | 9/2004 | Vartuli et al. | |
| 7,947,956 B2 | 5/2011 | Nakamura et al. | |
| 8,129,685 B2 | 3/2012 | Nakamura et al. | |
| 8,278,624 B2 | 10/2012 | Koschan et al. | |
| 8,394,195 B2 | 3/2013 | Andreaco et al. | |
| 8,617,422 B2 | 12/2013 | Koschan et al. | |
| 9,664,800 B2 * | 5/2017 | Andreaco | G01T 1/2002 |
| 2003/0127630 A1 * | 7/2003 | Vartuli | C09K 11/7774 252/301.4 R |
| 2006/0219927 A1 * | 10/2006 | Venkataramani | C09K 11/7774 250/370.11 |
| 2007/0187645 A1 * | 8/2007 | Lyons | C09K 11/7774 252/301.4 R |
| 2008/0017802 A1 * | 1/2008 | Nakamura | C09K 11/7774 250/361 R |
| 2010/0059681 A1 | 3/2010 | Nakamura et al. | |
| 2010/0078595 A1 | 4/2010 | Eriksson et al. | |
| 2012/0145962 A1 * | 6/2012 | Fukuta | C09K 11/7774 252/301.4 R |
| 2013/0306874 A1 | 11/2013 | Yoshikawa et al. | |
| 2015/0034829 A1 | 2/2015 | Koschan et al. | |
| 2016/0170043 A1 * | 6/2016 | Andreaco | G01T 1/2002 250/368 |

FOREIGN PATENT DOCUMENTS

| | | |
|---|---|---|
| EP | 3138891 A1 | 3/2017 |
| JP | H10247750 | 9/1998 |
| JP | 2000-212557 | 8/2000 |
| JP | 2006-233158 | 9/2006 |
| JP | 2007217456 A | 8/2007 |
| JP | 2009-530443 A | 8/2009 |
| JP | 2012066994 A | 4/2012 |
| JP | 6590699 | 9/2019 |
| JP | 6684876 B2 | 4/2020 |
| WO | WO 99/033934 | 7/1999 |
| WO | WO 2007/018345 | 2/2007 |
| WO | WO 2007/109084 A2 | 9/2007 |
| WO | WO 2012/066424 A1 | 5/2012 |
| WO | WO 2014/171985 | 10/2014 |
| WO | WO 2017/059832 A1 | 4/2017 |

OTHER PUBLICATIONS

Kang et al. Preparation and luminescence characterization of GGAG:Ce3+,B3+ for a white light-emitting diode, Materials Research Bulletin vol. 43, No. 8-9 (Aug.-Sep. 2008), pp. 1982-1988.*

Yang et al. Performance Improvement of Large Sr2+ and Ba2+ co-doped LaBr3:Ce3+ Scintillation Crystals, 2012 IEEE Nuclear Science Symposium and Medical Imaging Conference Record (Oct.-Nov. 2012), pp. 308-311.*

Kamada, K .[et al.]: Scintillator-oriented combinatorial search in Ce-doped (Y,Gd)3 (Ga,Al)5O12 multicomponent garnet compounds. In: J.Phys.D:Appl. Phys.,vol. 44,2011,505104.-ISSN0022-3727 (Year: 2011).*

Brandie et al., "Effects of impurities and atmosphere on the growth of Cr-doped gadolinium scandium gallium garnet. I." J. Crystal Growth, 85, 223-228 (1987).

Cherepy et al., "Transparent ceramic scintillators for gamma-ray spectroscopy and radiography," Proc. SPIE 7805, 780501 (2010); doi:10.1117/2.1201009.003196.

Kamada et al., "2 Inch diameter single crystal growth and scintillator properties of Ce:$Gd_3Al_2Ga_3O_{12}$," Journal of Crystal Growth, 352(1), 88-90 (2012).

Kamada et al., "Composition Engineering in Cerium-doped $(Lu,Gd)_3(Ga,Al)_5O_{12}$ Single Crystal Scintillators," Crystal Growth and Design, 11, 4484-4490 (2011).

Kamada et al., "Growth and scintillation properties of Pr doped $Gd_3(Ga,Al)_5O_{12}$ single crystals," Journal of Crystal Growth (2012); doi:10.1016/j.jcrysgro.201 2.02.002 (4 pages).

Kamada et al., "Large size single crystal growth of $Lu_3Al_5O_{12}$:Pr and their uniformity of scintillation properties," Journal of Crystal Growth, 351(1), 91-94 (2012); doi:10.1016/j.jcrysgro.2011.11.079.

Kamada et al., "Scintillation properties of Ce doped $Gd_2Lu_1(GaAl)_5O_{12}$ single crystal grown by micro-pulling-down method," J. Crystal Growth, 352, 35-38 (2012).

Kamada et al., "Scintillator-oriented combinatorial search in Ce-doped $(Y,Gd)_3(Ga,Al)_5O_{12}$ multicomponent garnet compounds," J. Phys.D: Appl. Phys., 44 505104 (2011); doi:10.1088/0022-3727/44/50/505104 (8 pages).

Kang et al., "Preparation and luminescence characterization of GGAG:$Ce^{3+}$, $B^{3+}$ for a white light-emitting diode," Materials Research Bulletin, 43, 1982-1988 (2008).

Kato et al., "A novel gamma-ray detector with submillimeter resolutions using a monolithic MPPC array with pixelized Ce:LYSO and Ce:GGAG crystals," Nuclear Instruments and Methods in Physics Research A, 699, 235-241 (published online Apr. 26, 2012).

Kuwano and Saito, "Crystal growth and optical properties of Nd:GGAG," J. Crystal Growth, 92, 17-22 (1988).

Notification of Transmittal of the International Search Report and the Written Opinion of the International Searching Authority, or the Declaration corresponding to PCT/US2014/012799, dated Nov. 5, 2014.

Solodovnikov et al., "Single crystal Ce doped scintillator material with garnet structure sensitive to gamma ray and neutron radiation," J. Crystal Growth (2012); doi:10.1016/j.jcrysgro.2012.03.009 (4 pages).

Tyagi et al., "Effect of Ca2+ co-doping on the scintillation kinetics of Ce-doped $Gd_3Ga_3Al_2O_{12}$," IEEE Transactions on Nuclear Science, vol. PP(99), 1-4 (Sep. 4, 2013).

Tyagi et al., "Effect of codoping on scintillation and optical properties of a Ce-doped $Gd_3Ga_3Al_2O_{12}$ scintillator," J. Phys. D: Appl. Phys., 46, 275302 (Oct. 31, 2013); doi:10.1088/0022-3727/46/47/475302.

Notification Concerning Transmittal of International Preliminary Report on Patentability (Chapter I of Patent Cooperation Treaty) correspondeing to PCT/US2014/012799, dated Aug. 6, 2015.

Cherepy et al., Nuclear Instruments & Methods in Physics Resarch Section A: Accelerators Spectrometers Detectors and Associated Equipment, 579(1), 38-41 (2007).

Cherepy et al., "Selection and development of new scintillators for the LHC," slides 1-8, Lawrence Livermore National Laboratory, CMS Upgrade Week and Workshop Nov. 7-11, 2011, at Fermilab in Batavia, Illinois, dated Nov. 8, 2011.

(56) References Cited

OTHER PUBLICATIONS

Liu et al., "Effect of Mg2+ co-dopiing on the scintillation performance of LuAG:Ce ceramics," Phys.Status Solidi RRL p. 1-5 (2014).
Notification of the first office action for Chinese Patent Application No. 2014800056060 dated May 30, 2016.
Yang et al., J. Luminescence, 132, 1824-1829 (2012).
Dhanaraj et al., "Springer Handbook of Crystal Growth," Springer, pp. 1-1816 (2010).
Koschan et al., "A comparison of the effect of Ca2+ doping in cerium doped GSO with that of LSO and YSO," J. Crystal Growth, 352, pp. 133-136 (2012).
Melcher et al., "Scintillator design via codoping," Proc. Int. Symp. on Radiation Detectors and Their Uses, JPS Conf. Proc 11, 020001:1-02001:8 (2016); doi:10.7566/JPSCP.11.020001.
Sefat, "Flux Method for Preparing Crystals," Division of Materials Sciences and Engineering, U.S. Department of Energy, pp. 1-57 (2010).
Shimura, "Zr doped GSO: Ce single crystals and their scintillation performance," IEEE Transactions on Nuclear Science, vol. 53, Issue 5, pp. 2519-2522 (Nov. 2006); DOI: 10.1109/TNS2006.876006.
Spurrier et al., "The effect of co-doping on the growth stability and scintillation properties of lutetium oxyorthosilicate," J. Crystal Growth, 310, 2110-2114 (2008).
Donnald et al., "The effect of B3+ and Ca2+ co-doping on factors which affect the energy resolution of Gd3Ga3Al2O12:Ce," IEEE Transactions on Nuclear Science, 60(5), 4002-4006 (Oct. 2013).
Yeom et al., "First performance results of Ce:GAGG scintillation crystals with silicon photomultipliers," IEEE Trans. On Nuclear Sci., 60(2), 988-992 (Apr. 2013).
Yoshikawa et al., "Crystal growth and characterization of Ce:Gd3(Ga,Al)5O12 single crystal using floating zone method in different O2 partial pressures." Optical Materials, (2013); https:/dx.doi.org/10.1016/j.optmat.2013.02.021 pp. 1-5 (Sep. 2013).
Second Office Action for Chinese Patent Application No. 2016112301485260 dated Nov. 28, 2016.
Kurosawa et al., "Luminescent properties of Ce:Gd3(Al,Ga,Mg,M)5O12 crystal (M = Zr, Hf )," Japanese Journal of Applied Physics, vol. 53, No. 04EG14, pp. 1-4 (2014).
Meng et al., "Effect of annealing atmosphere on the cerium valence state and F þ luminescence center in Ca-codoped GGAG:Ce single crystals," Phys. Status Solidi B, vol. 252, No. 6, pp. 1394-1401 (2015).
Meng et al., "Relationship between Ca2+ concentrationandtheproperties of codoped Gd3Ga3Al2O12: Ce scintillators," Nuclear Instruments and Methods in Physics Research A, vol. 797, pp. 138-143 (2015).
Official Action corresponding to Chinese Patent Application No. 2016112301485260 dated Nov. 28, 2016.
Official Action corresponding to Japanese application No. 2015-553932 dated May 31, 2017.
Official Action corresponding to Chinese Patent Application No. 201611230148526.0 dated Jun. 13, 2017.
Tyagi et al., "Effect of Ca2+ Do-Doping on the Scintillation Kinetics of Ce Doped Gd3Ga3Al2O12," IEEE Transactions on Nuclear Science, vol. 61, No. 1, pp. 297-300 (Feb. 2014).
Tyagi et al., "Effect of Co-doping On the Radiation Hardness of Gd3Ga3Al2O12: Ce Scintillators," IEEE Transactions on Nuclear Science, vol. 62, No. 1, pp. 336-339 (Feb. 2015).
Wu et al., "Role of Ce4p in the Scintillation Mechanism of Codoped Gd3Ga3Al2O12:Ce," Physical Review Applied, vol. 2, No. 044009, pp. 1-13 (2014).
Meng et al., "Sintered pellets: A simple and cost effective method to predict the performance of GGAG: Ce single crystals," Materials Science and Engineering: B, vol. 193, pp. 20-26 (2015).
Wu et al., "Single crystal and optical ceramic multicomponent garnet scintillators: A comparative study," Nuclear Instruments and Methods in Physics Research Section A, vol. 780, pp. 45-50 (2015).
Decision to Grant corresponding to Japanese Patent Application No. 2015-553932 dated Sep. 9, 2019.
Decision to Grant corresponding to Japanese Patent Application No. 2018-181381 dated Mar. 2, 2020.
Office Action corresponding to Japanese application No. 2015-553932 dated Feb. 25, 2019.
Office Action corresponding to Japanese application No. 2018-181381 dated Sep. 11, 2019.
Office Action corresponding to Chinese Patent Application No. 201480005906.0 dated Dec. 28, 2017.
Office Action corresponding to Japanese application No. 2015-553932 dated Apr. 23, 2018.
Office Action corresponding to German application No. 112014000521.5 dated Sep. 27, 2022, English translation.
Zamoryanskaya, M. V.; Burakov, B. E.: Cathodoluminescence of Ce, U and Pu in a garnet host phase. In: Mater. Res. Soc. Symp. Proc., vol. 608, 1999, pp. 437-442.

* cited by examiner

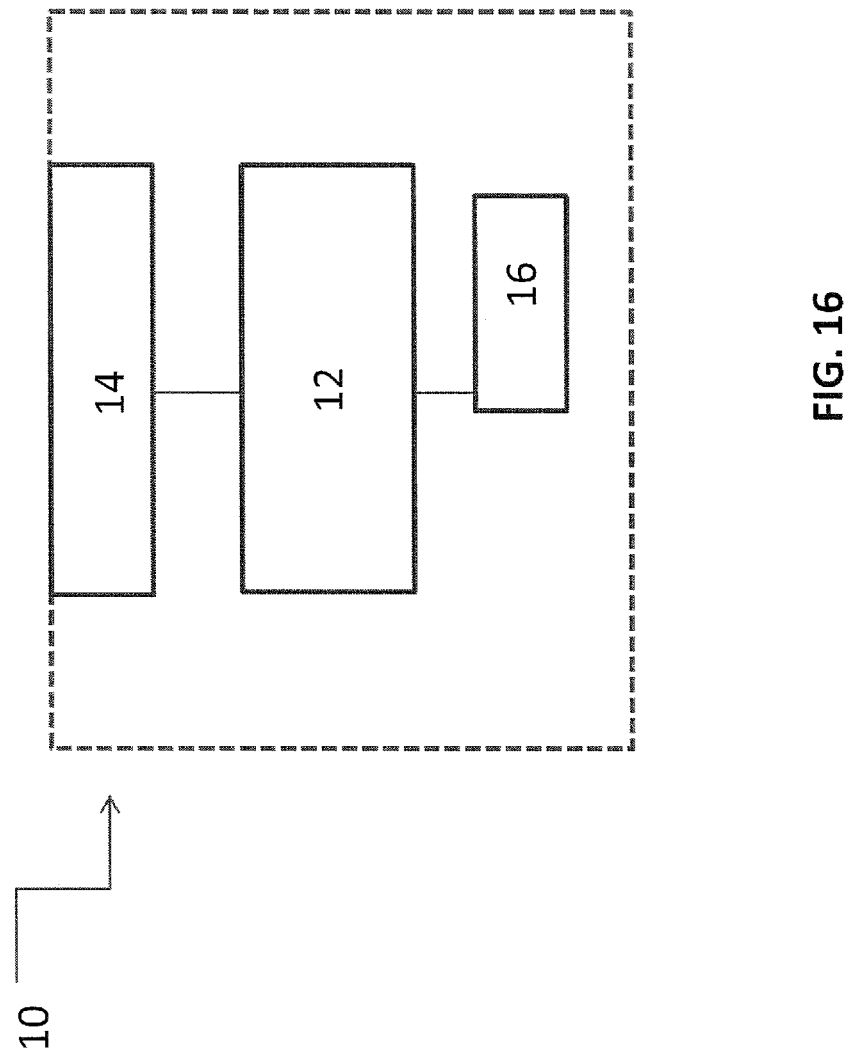

US 11,584,885 B2

CODOPING METHOD FOR MODIFYING THE SCINTILLATION AND OPTICAL PROPERTIES OF GARNET-TYPE SCINTILLATORS

RELATED APPLICATIONS

The presently disclosed subject matter is based on and claims the benefit of U.S. Provisional Patent Application Ser. No. 61/755,799, filed Jan. 23, 2013; the disclosure of which is incorporated herein by reference in its entirety.

GOVERNMENT INTEREST

This invention was made with government support under contract DE-NA0000473 awarded by the Department of Energy. The government has certain rights in the invention.

PARTIES TO A JOINT RESEARCH AGREEMENT

The claimed invention was made by, on behalf of, and/or in connection with one or more of the following parties to a joint research agreement: Siemens Medical Solutions USA, Inc., and The University of Tennessee. The agreement was in effect on and before the effective filing date of the presently disclosed subject matter, and the presently disclosed subject matter was made as a result of activities undertaken within the scope of the agreement.

TECHNICAL FIELD

The presently disclosed subject matter relates to codoping methods of altering the scintillation and/or optical properties of garnet-type single crystal, polycrystalline, and ceramic scintillator materials, such as, for example gadolinium gallium aluminum garnet-type scintillator materials. The presently disclosed subject matter further relates to the codoped scintillator materials, to radiation detectors comprising the codoped scintillator materials, and to methods of detecting high energy particles using the radiation detectors.

ABBREVIATIONS

%=percentage
° K=degrees Kelvin
Al=aluminum
B=boron
Ba=barium
C=Celsius
Ca=calcium
Ce=cerium
cm=centimeter
CT=computed tomography
Ga=gallium
Gd=gadolinium
GGAG=gadolinium gallium aluminum garnet
K=Kelvin
keV=kiloelectronvolt
LO=light output
Lu=lutetium
MeV=megaelectronvolt
MPa=megapascal
nm=nanometer
ns=nanoseconds
PET=positron emission tomography
PL=photoluminescence
PMT=photomultiplier tube
Pr=praseodymium
RL=radioluminescence
SPECT=single photon emission computed tomography
TL=thermoluminescence
Y=yttrium

BACKGROUND

Cerium doped scintillators are scientifically and economically important materials used in conjunction with photodetectors to detect high-energy photons and particles in various applications, including high-energy physics, medical imaging, geological exploration, and homeland security. Certain characteristics can be desirable in these scintillators, in order to maximize their value in these applications. In general, high scintillation light yield, fast scintillation kinetics (both in decay time and rise time), good energy resolution, a high degree of proportionality, and/or relative insensitivity to ambient light exposure can be desired. To these ends, it can be desirable to obtain a composition free or relatively free of electron/hole traps and other defects that might impede the scintillation process. A good thermal response, in which the scintillator has good performance over a wide temperature range, can also be desirable.

Therefore, there is an ongoing need for additional scintillator materials that can have, for example, increased light yield, increased energy resolution, increased proportionality, reduced light sensitivity, temperature independence, longer decay time, shorter decay time, and/or shorter rise time. There is also an ongoing need for additional methods to tailor the properties of scintillator materials, such as rare-earth gallium aluminum garnets, to meet one or more particular needs of different applications.

SUMMARY

In some embodiments, the presently disclosed subject matter provides a material comprising: $Gd_{3-x-y-z}R_xD_yE_zAl_{5-s}Ga_sO_{12}$, wherein R is Lu or Y; D is at least one trivalent dopant ion; E is at least one codopant ion; $0 \le x \le 2$; $0.0001 \le y \le 0.15$; $0.0001 \le z \le 0.15$; and $1 \le s \le 4.0$; wherein said material is a single crystal, polycrystalline, or ceramic material. Optionally, E is not an ion of an element selected from one or more of the group consisting of Sc, Mg, Ni, Ti, Zr, Hf, Si, and Ge.

In some embodiments, the at least one trivalent dopant ion is $Ce^{3+}$ or $Pr^{3+}$. In some embodiments, E is an ion of an element selected from the group consisting of Ba, B, Ca, Fe, Bi, Cr, Zn, Ag, Nb, K, Na, Sr, and Cu, or any subset thereof. In some embodiments, the at least one codopant ion is $Ca^{2+}$, $B^{3+}$, or $Ba^{2+}$.

In some embodiments, x is 0 and s is 2 or 3. In some embodiments, y is about 0.006. In some embodiments, z is between about 0.006 and about 0.012. In some embodiments, the ratio of dopant ion to the codopant ion ranges from about 10:1 to about 1:10.

In some embodiments, the material is a single crystal.

In some embodiments, the presently disclosed subject matter provides a radiation detector comprising the material comprising $Gd_{3-x-y-z}R_xD_yE_zAl_{5-s}Ga_sO_{12}$, wherein R is Lu or Y; D is at least one trivalent dopant ion; E is at least one codopant ion; $0 \le x \le 2$; $0.0001 \le y \le 0.15$; $0.0001 \le z \le 0.15$; and $1 \le s \le 4.0$; wherein said material is a single crystal, polycrystalline, or ceramic material. Optionally, E is not an ion of an element selected from one or more of the group consisting of Sc, Mg, Ni, Ti, Zr, Hf, Si, and Ge. In some embodiments, the detector is a medical diagnostic device, a device for oil exploration, and/or a device for container, vehicle, human, animal, or baggage scanning. In some embodiments, the medical diagnostic device is a positron emission tomography (PET) device, a single photon emission computed tomography (SPECT) device, or a planar nuclear medical imaging device.

In some embodiments, the presently disclosed subject matter provides a method of detecting gamma rays, X-rays, cosmic rays, and/or particles having an energy of 1 keV or greater, the method comprising using the detector comprising the material comprising $Gd_{3-x-y-z}R_xD_yE_zAl_{5-s}Ga_sO_{12}$, wherein R is Lu or Y; D is at least one trivalent dopant ion; E is at least one codopant ion; $0 \leq x \leq 2$; $0.0001 \leq y \leq 0.15$; $0.0001 \leq z \leq 0.15$; and $1 \leq s \leq 4.0$; wherein said material is a single crystal, polycrystalline, or ceramic material. Optionally, E is not an ion of an element selected from one or more of the group consisting of Sc, Mg, Ni, Ti, Zr, Hf, Si, and Ge.

In some embodiments, the presently disclosed subject matter provides a method of preparing a material comprising $Gd_{3-x-y-z}R_xD_yE_zAl_{5-s}Ga_sO_{12}$, wherein R is Lu or Y; D is at least one trivalent dopant ion; E is at least one codopant ion; $0 \leq x \leq 2$; $0.0001 \leq y \leq 0.15$; $0.0001 \leq z \leq 0.15$; and $1 \leq s \leq 4.0$. Optionally, E is not an ion of an element selected from one or more of the group consisting of Sc, Mg, Ni, Ti, Zr, Hf, Si, and Ge. Optionally, the material is a single crystal, said method comprising obtaining a crystal from a melt.

In some embodiments, the presently disclosed subject matter provides a method of altering one or more scintillation and/or optical properties of a rare-earth gallium aluminum garnet-type scintillator (e.g., a material comprising $Gd_{3-x-y-z}R_xD_yE_zAl_{5-s}Ga_sO_{12}$), the method comprising preparing the rare-earth gallium aluminum garnet-type scintillator in the presence of a dopant ion and a codopant ion. Optionally, the codopant ion is not an ion of an element selected from one or more of the group consisting of Sc, Mg, Ni, Ti, Zr, Hf, Si, and Ge.

In some embodiments, the rare-earth gallium aluminum garnet-type scintillator is a single crystal and the method comprises: (a) forming a mixture for the growth of the garnet-type scintillator, wherein forming said mixture comprises providing a predetermined amount of a dopant ion and a predetermined amount of at least one codopant ion; (b) melting said mixture to form a melt; and (c) growing a crystal from said melt, thereby obtaining a codoped single crystal garnet-type scintillator.

In some embodiments, each of the one or more scintillation and/or optical properties is selected from the group comprising scintillation light yield, decay time, rise time, energy resolution, proportionality, and sensitivity to light exposure.

In some embodiments, the dopant ion is $Ce^{3+}$ and the codopant is $Ca^{2+}$, and the method provides a rare-earth gallium aluminum garnet-type scintillator that exhibits one or more of faster decay, shorter rise time, or reduced light sensitivity as compared to a non-codoped rare-earth gallium aluminum garnet type scintillator. In some embodiments, the dopant ion is $Ce^{3+}$ and the codopant is $Ba^{2+}$, and the method provides a rare-earth gallium aluminum garnet-type scintillator that exhibits increased light yield compared to a non-codoped rare-earth gallium aluminum garnet type scintillator. In some embodiments, the dopant ion is $Ce^{3+}$ and the codopant is $B^{3+}$, and the method provides a rare-earth gallium aluminum garnet-type scintillator that exhibits one or more of better energy resolution, increased light yield, longer decay time, shorter rise time, better proportionality, and reduced light sensitivity compared to a non-codoped rare-earth gallium aluminum garnet type scintillator.

In some embodiments, the method further comprising annealing said codoped garnet-type scintillator (e.g., said single crystal rare-earth gallium aluminum garnet-type scintillator). In some embodiments, the annealing is performed in air, nitrogen, or a mixture of nitrogen and hydrogen. In some embodiments, the annealing is performed at a temperature between about 800 and about 1600 degrees Celsius (C).

In some embodiments, the presently disclosed subject matter provides a composition comprising a cerium doped gadolinium gallium aluminum garnet (GGAG), such as $Gd_3Ga_3Al_2O_{12}$ or $Gd_3Ga_2Al_3O_{12}$, wherein the cerium doped GGAG is co-doped with a codopant ion. In some embodiments, the codopant ion is selected from the group comprising $Ca^{2+}$, $B^{3+}$, and $Ba^{2+}$. In some embodiments, the cerium doped GGAG is prepared from a melt. In some embodiments, the cerium doped GGAG is a single crystal or ceramic.

In some embodiments, the presently disclosed subject matter provides a device comprising a photodetector and a composition comprising a cerium doped GGAG, such as $Gd_3Ga_3Al_2O_{12}$ or $Gd_3Ga_2Al_3O_{12}$, wherein the cerium doped GGAG is co-doped with a codopant ion. In some embodiments, the device is adapted for use in medical imaging, geological exploration, or homeland security.

In some embodiments, the presently disclosed subject matter provides a method of detecting high energy photons and particles, the method comprising using a device comprising a photodetector and a composition comprising cerium doped GGAG, such as $Gd_3Ga_3Al_2O_{12}$ or $Gd_3Ga_2Al_3O_{12}$, wherein the cerium doped GGAG is co-doped with a codopant ion.

In some embodiments, the presently disclosed subject matter provides a method of preparing a composition comprising a cerium doped GGAG, such as $Gd_3Ga_3Al_2O_{12}$ or $Gd_3Ga_2Al_3O_{12}$, wherein the cerium doped GGAG is co-doped with a codopant ion, said method comprising pulling a single crystal from molten raw materials.

In some embodiments, the presently disclosed subject matter provides a method of altering one or more scintillation and/or optical properties of a cerium doped GGAG (e.g., $Gd_3Ga_3Al_2O_{12}$ or $Gd_3Ga_2Al_3O_{12}$) scintillator material, the method comprising preparing the cerium doped GGAG scintillator material in the presence of a codopant ion, thereby providing a codoped GGAG scintillator material (e.g., a codoped $Gd_3Ga_3Al_2O_{12}$ or $Gd_3Ga_2Al_3O_{12}$ scintillator material). In some embodiments, the codopant ion is selected from the group comprising $Ca^{2+}$, $B^{3+}$, and $Ba^{2+}$.

In some embodiments, the codoped GGAG scintillator material comprises a single crystal and the method comprises: (a) forming a melt for the growth of the cerium doped GGAG (e.g., the cerium doped $Gd_3Ga_3Al_2O_{12}$ or $Gd_3Ga_2Al_3O_{12}$) scintillator material; (b) adding a co-dopant to the melt; and (c) pulling a crystal from said melt.

In some embodiments, each of the one or more scintillation and/or optical properties is selected from the group comprising scintillation light yield, decay time, rise time, energy resolution, proportionality, and sensitivity to light exposure. In some embodiments, the codopant ion is $Ca^{2+}$, and the method provides a codoped GGAG (e.g., a codoped $Gd_3Ga_3Al_2O_{12}$ or $Gd_3Ga_2Al_3O_{12}$) scintillator that exhibits one or more of faster decay, shorter rise time, or reduced light sensitivity as compared to a non-codoped GGAG scintillator (e.g., a non-codoped $Gd_3Ga_3Al_2O_{12}$ or $Gd_3Ga_2Al_3O_{12}$ scintillator). In some embodiments, the codopant ion is $Ba^{2+}$, and the method provides a codoped GGAG (e.g., a codoped $Gd_3Ga_3Al_2O_{12}$ or $Gd_3Ga_2Al_3O_{12}$) scintillator that exhibits increased light yield compared to a non-codoped GGAG scintillator (e.g., a non-codoped $Gd_3Ga_3Al_2O_{12}$ or $Gd_3Ga_2Al_3O_{12}$ scintillator). In some embodiments, the codopant ion is $B^{3+}$, and the method provides a codoped GGAG (e.g., a codoped $Gd_3Ga_3Al_2O_{12}$ or $Gd_3Ga_2Al_3O_{12}$) scintillator that exhibits one or more of better energy resolution, increased light yield, longer decay time, shorter rise time, better proportionality, and reduced light sensitivity compared to a non-codoped GGAG scintillator (e.g., a non-codoped $Gd_3Ga_3Al_2O_{12}$ or $Gd_3Ga_2Al_3O_{12}$ scintillator).

In some embodiments, the method further comprises annealing the codoped GGAG scintillator (e.g., the codoped $Gd_3Ga_3Al_2O_{12}$ or $Gd_3Ga_2Al_3O_{12}$ scintillator). In some embodiments, the annealing is performed in air, nitrogen, or a mixture of nitrogen and hydrogen.

Accordingly, it is an object of the presently disclosed subject matter to provide codoped rare-earth gallium aluminum garnet-type scintillator materials and radiation detectors comprising said scintillator materials; methods of detecting gamma rays, X-rays, cosmic rays and/or particles having an energy of 1 keV or greater with said radiation detectors; methods of preparing said scintillator materials; and methods of altering one or more scintillation and/or optical properties of said scintillator materials.

An object of the presently disclosed subject matter having been stated hereinabove, and which is achieved in whole or in part by the presently disclosed subject matter, other objects will become evident as the description proceeds hereinbelow.

BRIEF DESCRIPTION OF THE DRAWINGS

FIG. 16 is a schematic drawing of an apparatus for detecting radiation according to the presently disclosed subject matter. Apparatus 10 includes photon detector 12 optically coupled to scintillator material 14. Apparatus 10 can optionally include electronics 16 for recording and/or displaying electronic signal from photon detector 12. Thus, optional electronics 16 can be in electronic communication with photon detector 12.

DETAILED DESCRIPTION

Figure 1:
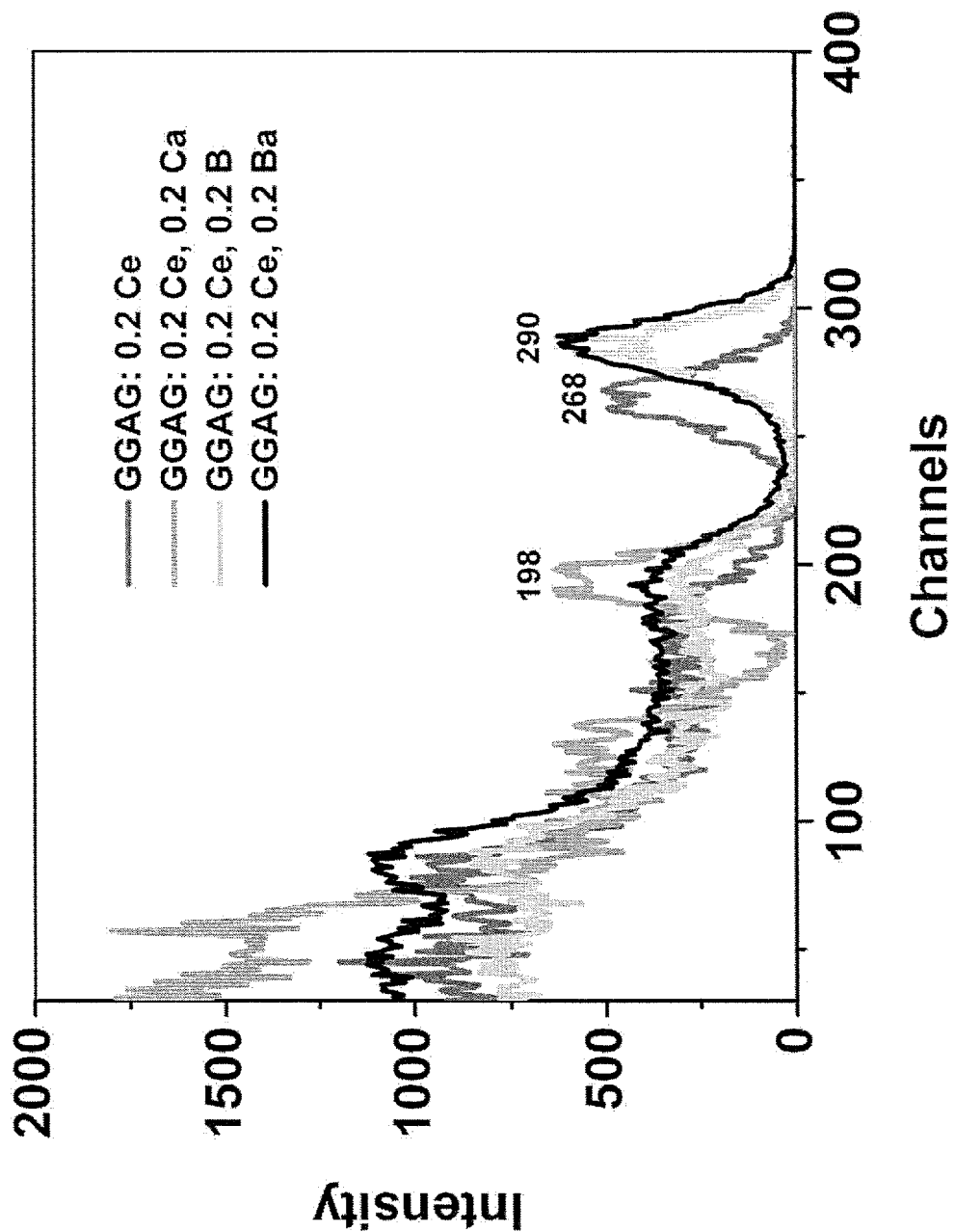
FIG. 1 is a graph showing the effect of calcium (Ca), boron (B), and barium (Ba) codoping on relative scintillation light output in cerium doped gadolinium gallium aluminum garnet (GGAG)-type single crystal scintillators on a scale where a reference (i.e., bismuth germanate (BGO)) light output was set at channel 100. Light output is shown for a 0.2 atomic % cerium doped GGAG crystal codoped with 0.2 atomic % calcium (GGAG: 0.2 Ce, 0.2 Ca; medium grey line); a 0.2 atomic % cerium doped GGAG crystal codoped with 0.2 atomic % boron (GGAG: 0.2 Ce, 0.2 B, light grey line); and a 0.2 atomic % cerium doped GGAG crystal codoped with 0.2 atomic % barium (GGAG: 0.2 Ce, 0.2 Ba, black line). Light output for a 0.2 atomic % cerium doped GGAG crystal (GGAG: 0.2 Ce, dark grey line) without a codopant is shown for comparison. All dopant and codopant atomic percentages are relative to gadolinium (Gd) in the initial melt from which the crystals were grown.

The presently disclosed subject matter will now be described more fully. The presently disclosed subject matter can, however, be embodied in different forms and should not be construed as limited to the embodiments set forth herein below and in the accompanying Examples. Rather, these embodiments are provided so that this disclosure will be thorough and complete, and will fully convey the scope of the embodiments to those skilled in the art.

All references listed herein, including but not limited to all patents, patent applications and publications thereof, and scientific journal articles, are incorporated herein by reference in their entireties to the extent that they supplement, explain, provide a background for, or teach methodology, techniques, and/or compositions employed herein.

I. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long-standing patent law convention, the terms "a", "an", and "the" refer to "one or more" when used in this application, including the claims.

The term "and/or" when used in describing two or more items or conditions, refers to situations where all named items or conditions are present or applicable, or to situations wherein only one (or less than all) of the items or conditions is present or applicable.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" can mean at least a second or more.

The term "comprising", which is synonymous with "including," "containing," or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified in the claim. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed and claimed subject matter can include the use of either of the other two terms.

Unless otherwise indicated, all numbers expressing quantities of time, temperature, light output, atomic percentage (%), and so forth used in the specification and claims are to be understood as being modified in all instances by the term "about". Accordingly, unless indicated to the contrary, the numerical parameters set forth in this specification and attached claims are approximations that can vary depending upon the desired properties sought to be obtained by the presently disclosed subject matter.

As used herein, the term "about", when referring to a value is meant to encompass variations of in one example ±20% or ±10%, in another example ±5%, in another example ±1%, and in still another example ±0.1% from the specified amount, as such variations are appropriate to perform the disclosed methods.

The terms "garnet" and "garnet-type" scintillator as used herein refer to compounds having mainly a chemical formula $A_3B_2C_3O_{12}$, wherein cations A, B, and C have three different types of sites, each site being surrounded by oxygen ions. A is dodecahedrally coordinated with oxygen; B is octahedrally coordinated with oxygen; and C is tetrahedrally coordinated with oxygen. In some embodiments, A is a rare-earth element cation. The scintillator can also comprise a small amount (e.g., less than about 5 atomic % or less than about 1 atomic % relative to A) of each of one or more dopant ions (e.g., a dopant ion and a codopant ion). In some embodiments, each dopant or codopant is present at 0.5 atomic % or less relative to A. In some embodiments, the rare-earth element is Gd, Y, or Lu. In some embodiments, at least a portion of the rare-earth element A is Gd. In some embodiments, B and C can be gallium or aluminum cations (or mixtures of gallium and aluminum cations).

In some embodiments, the garnet-type scintillator is a gadolinium gallium aluminum garnet (GGAG). As used herein, GGAG can refer to a material having the formula $(Gd,R)_3(Ga,Al)_5O_{12}$ wherein R is a rare-earth element such as Y or Lu. In some embodiments, the formula can include between about 1 and about 3 Gd ions (i.e., the GGAG can contain between 0 to about 2 R ions). Exemplary GGAG include, but are not limited to, $Gd_3Ga_3Al_2O_{12}$, $Gd_3Ga_2Al_3O_{12}$, $Gd_3Ga_1Al_4O_{12}$, $Gd_3Ga_4Al_1O_{12}$, $Gd_2Lu_1Ga_3Al_2O_{12}$, and the like. In some embodiments, the GGAG is $Gd_3Ga_3Al_2O_{12}$ or $Gd_3Ga_2Al_3O_{12}$.

In some embodiments, the compositional formula expression of a scintillator material can contain a colon ":", wherein the main matrix material is indicated on the left side of the colon, and the activator ion and any codopant ion are indicated on the right side of the colon. Thus, for example, GGAG:Ce, B represents a gadolinium gallium aluminum garnet activated by cerium and codoped with boron.

The term "scintillator" refers to a material that emits light (e.g., visible light) in response to stimulation by high energy radiation (e.g., X, β, or γ radiation).

The term "high energy radiation" can refer to electromagnetic radiation having energy higher than that of ultraviolet radiation, including, but not limited to X radiation (i.e., X-ray radiation), gamma (γ) radiation, and beta (β) radiation. In some embodiments, the high energy radiation refers to gamma rays, cosmic rays, X-rays, and/or particles having an energy of 1 keV or greater. Scintillator materials as described herein can be used as components of radiation detectors in apparatuses such as counters, image intensifiers, and computed tomography (CT) scanners.

II. General Considerations

Generally, garnets have a cubical crystal structure represented by a chemical formula $A_3B_2C_3O_{12}$, wherein A (e.g., Gd or Lu) is a dodecahedral site, B (e.g., Ga or Al) is an octahedral site, C (e.g., Ga or Al) is a tetrahedral site, and each site is surrounded by oxygen ions. Doping a rare-earth gallium and/or aluminum garnet with a rare-earth element activator, such as $Ce^{3+}$, usually replaces a dodecahedral site. Thus the rare-earth element activator is dodecahedrally coordinated with ligand ions (oxygen) with D2 point group symmetry. When the exemplary garnet-type material $Gd_3Ga_3Al_2O_{12}$ is doped with $Ce^{3+}$ as an activator, light can be emitted as the result of the allowed transition of $Ce^{3+}$ from the 5d level to the 4f level.

In some embodiments, the presently disclosed subject matter provides co-doped garnet-type scintillator materials. These co-doped scintillators can have different optical and/or scintillation properties than their non-co-doped counterparts (e.g., than the scintillator with the same formula, but doped only with an activator ion). The addition of a small amount of a co-dopant (i.e., a dopant in addition to activator dopant ion, such as $Ce^{3+}$ or $Pr^{3+}$) can have the ability to modify the scintillation performance of a garnet-type single crystal and/or ceramic or polycrystalline scintillator in order to obtain properties optimized for various applications. For instance, codoping can change the crystal field splitting, which can consequently affect the energy transfer and emission properties of the activator ions. Alternatively or additionally, codoping can change defect structures (e.g., shallow, room temperature, deep, and/or hole trap centers) in the scintillator material, which can affect such properties as the rise time and the light sensitivity of the crystals.

Gadolinium gallium garnets are a promising class of scintillator, with high density and potentially good scintillation properties; these materials have been the subject of some interest in the field in recent years. For example, Kamada et al. have experimented with modifying the matrix composition in $(Lu_yGd_{1-y})_3(Ga_x,Al_{1-x})_5O_{12}$ single crystals, and found that by varying the relative ratio of Gd and Ga in these crystals, the position of the Ce excited state relative to the conduction band can be altered. See Kamada et al., 2011.

Single crystal $Lu_3Al_5O_{12}$ (LuAG) doped with cerium or praseodymium has interesting properties as well, including high light yield and short decay time. See Kamada et al., 2012a; and Kamada et al., 2012b. These materials have also been prepared in ceramic form. See Cherepy et al., 2010; and Cherepy et al., 2007.

Trivalent boron (B) has been used to aid in the synthesis of GGAG:Ce powder phosphor for use in LEDs. See Kang et al., 2008 and PCT International Application Publication No. WO 2007/018345. Samples with an additional boron dopant exhibited increased photoluminescence intensity under excitation of 470 nm photons when compared to samples doped with cerium only. Kang et al. suggested that this could to be due to increased crystallinity of the phosphor powders. However, the presently disclosed subject matter relates to single crystals, polycrystalline materials and/or ceramics, not to powder phosphors. It would be understood by one of ordinary skill in the art that, due to the very different synthesis conditions for the single crystals and other presently disclosed materials versus phosphors and the much lower achievable dopant concentrations in the present materials, the results of boron codoping in the presently disclosed single crystal, polycrystalline, and ceramic materials is not predictable based on the work with powder phosphors.

In some embodiments, the presently disclosed subject matter provides a garnet-type single crystal, polycrystalline and/or ceramic material comprising a trivalent activator/dopant ion and a codopant ion. In some embodiments the garnet-type material is a rare-earth gallium aluminum garnet. In some embodiments, the rare-earth element of the rare-earth gallium aluminum garnet is other than Sc. In some embodiments, the rare-earth element of the rare-earth gallium aluminum garnet is gadolinium (Gd), lutetium (Lu), yttrium (Y), or a mixture thereof. In some embodiments, at least some of the rare-earth element component is gadolinium. In some embodiments, the trivalent activator/dopant ion is an ion of a rare-earth element (e.g., Ce, Pr, Nd, Sm, Eu, Dy, Ho, Er, or Tm). In some embodiments, the trivalent activator/dopant ion is $Ce^{3+}$ or $Pr^{3+}$.

The activator/dopant ion and the codopant ion are each present in the material in relatively small amounts, e.g., less than or about 1.0, 0.9, 0.8, 0.7, 0.6, 0.5, 0.4, 0.3, or 0.2 atomic percentage compared to the amount of the rare earth element or elements present in the main garnet matrix.

Unless otherwise indicated, when an atomic percentage of dopant or codopant ion is described, the atomic percentage is based on the amount of dopant or codopant ion present in the starting materials used to prepare the scintillator material (e.g., in the initial melt). This amount can vary in the prepared scintillator, e.g., due to segregation during melt growth. In some embodiments, the amount of dopant is about 0.5 atomic % or less compared to rare-earth element in the main garnet matrix. In some embodiments, the amount of dopant is about 0.2 atomic % compared to the rare-earth element in the main garnet matrix.

In some embodiments, the material comprises:

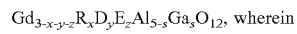

$Gd_{3-x-y-z}R_xD_yE_zAl_{5-s}Ga_sO_{12}$, wherein

R is Y or Lu;
D is at least one trivalent dopant ion;
E is at least one codopant ion;
$0 \le x \le 2$;
$0.0001 \le y \le 0.15$;
$0.0001 \le z \le 0.15$;
$1 \le s \le 4.0$; and
wherein said material is a single crystal, polycrystalline, and/or ceramic material.

Suitable dopant ions for D include, but are not limited to, $Ce^{3+}$, $Pr^{3+}$, $Nd^{3+}$, $Sm^{3+}$, $Eu^{3+}$, $Dy^{3+}$, $Ho^{3+}$, $Er^{3+}$, and $Tm^{3+}$. In some embodiments, the at least one trivalent dopant ion D is $Ce^{3+}$ or $Pr^{3+}$.

Suitable codopant ions for E can be ions of elements, such as, but not limited to, Ba, B, Ca, Fe, Bi, Cr, Zn, Ag, Nb, Sr, K, Na, and Cu (or any single one or sub-combination thereof). In some embodiments, more than one type of codopant ion is present. In some embodiments, the codopant is an ion of an element other than any one or more of Mg, Zr, Sc, Hf, Si, Ge, Ti, or Ni. In some embodiments, the at least one codopant is $Ca^{2+}$, $B^{3+}$, or $Ba^{2+}$. In some embodiments, the at least one codopant is $Ca^{2+}$ or $Ba^{2+}$.

The value x can describe the composition of rare-earth element R in the main garnet matrix (i.e., in the scintillator material excluding dopant and/or codopant ions). In some embodiments, x is between 0 and about 2. In some embodiments, x is between 0 and about 1. In some embodiments, x is 0 and the only rare-earth element in the main garnet matrix is Gd.

The value s can describe the ratio of Ga to Al. Varying this ratio can change the crystal lattice, which can result in crystal field changes and changes in the energy band structure. In some embodiments, s is about 2 or about 3. In some embodiments, x is 0 and s is 2 or 3.

The value y describes the composition of activator/dopant ion. If the amount of activator is too small, energy absorbed by the material is not converted as efficiently to light. If the amount of activator is too large, the distance between activator ions can become too small, resulting in quenching. In some embodiments, the activator/dopant ion is provided at between about 0.1 and about 0.5 atomic % (e.g., relative to the content of the rare earth elements (Gd+R) in the main garnet matrix). Thus, in some embodiments, y is between about 0.003 and about 0.015. As noted above, the common practice will be used herein of stating the amount of dopant relative to the rare-earth element (Gd+R) in the starting material mixture used to prepare the scintillator (e.g., the amount present in the melt from which the material is grown). The actual content of the dopant in the as prepared material can differ from this value (e.g., due to solid-liquid segregation, etc.). In some embodiments, the activator/dopant ion is provided at about 0.2 atomic %. Thus, in some embodiments, y is about 0.006.

The value z can determine the composition of codopant. In some embodiments, as described further hereinbelow, the copopant ion is believed to change the defect structure of the scintillator material, which can result in changes in the scintillation properties and/or performance of the material as compared to a similar non-codoped material. In some embodiments, the codopant is provided at between about 0.1 and about 0.5 atomic % (e.g., relative to the content of the rare earth elements (Gd+R) in the main garnet matrix). Thus, z can be between about 0.003 and about 0.015. As noted above for the dopant ion, the amount of codopant is expressed herein based upon the amount of codopant present in the starting material mixture used to prepare the scintillator. In some embodiments, the codopant is provided at between about 0.2 and about 0.4 atomic % relative to the rare-element in the main garnet matrix. Thus, in some embodiments, z can be between about 0.006 and about 0.012. In some embodiments, the ratio of dopant ion to codopant ion is between about 10:1 and about 1:10. In some embodiments, the ratio is between about 2:1 and about 1:3. In some embodiments, the ratio is between about 1:1 and about 1:2.

In some embodiments, the material is a single crystal material. By "single crystal" is meant a material manufactured by a liquid phase method having few or no grain boundaries and wherein each adjoining crystal grain generally has the same orientation. In some embodiments, the material can be polycrystalline and/or ceramic and contain crystals of varying size and/or orientation.

In some embodiments, the presently disclosed subject matter provides a composition comprising cerium doped gadolinium gallium aluminum garnet (GGAG), such as, for example $Gd_3Ga_3Al_2O_{12}$ or $Gd_3Ga_2Al_3O_{12}$, wherein the cerium doped GGAG is co-doped with a codopant ion. In some embodiments, the codopant ion is selected from the group comprising $Ca^{2+}$, $B^{3+}$, and $Ba^{2+}$. Thus, in some embodiments, the composition comprises GGAG:Ce,Ca. In some embodiments, the composition comprises GGAG:Ce,B. In some embodiments, the composition comprises GGAG:Ce,Ba. In some embodiments, the composition is prepared from a melt. In some embodiments, the composition is a single crystal or a ceramic.

In some embodiments, the composition comprises cerium doped $Gd_3Ga_3Al_2O_{12}$ or $Gd_3Ga_2Al_3O_{12}$, wherein the cerium doped $Gd_3Ga_3Al_2O_{12}$ or $Gd_3Ga_2Al_3O_{12}$ is co-doped with a codopant ion. In some embodiments, the codopant ion is selected from the group consisting of $Ca^{2+}$, $B^{3+}$, and $Ba^{2+}$. In some embodiments, the cerium doped $Gd_3Ga_3Al_2O_{12}$ or $Gd_3Ga_2Al_3O_{12}$ (i.e., the codoped cerium doped $Gd_3Ga_3Al_2O_{12}$ or $Gd_3Ga_2Al_3O_{12}$) is prepared from a melt. In some embodiments, the cerium doped $Gd_3Ga_3Al_2O_{12}$ or $Gd_3Ga_2Al_3O_{12}$ (i.e., the codoped cerium doped $Gd_3Ga_3Al_2O_{12}$ or $Gd_3Ga_2Al_3O_{12}$) is a single crystal or ceramic.

IV. Radiation Detectors, Related Devices and Methods

In some embodiments, the presently disclosed subject matter provides a radiation detector comprising a co-doped garnet-type scintillator material as described hereinabove. The radiation detector can comprise a scintillator (which absorbs radiation and emits light) and a photodetector (which detects said emitted light). The photodetector can be any suitable detector or detectors and can be optically coupled to the scintillator material for producing an electrical signal in response to emission of light from the scintillator material. Thus, the photodetector can be configured to convert photons to an electrical signal. For example, a signal amplifier can be provided to convert an output signal from a photodiode into a voltage signal. The signal amplifier can also be designed to amplify the voltage signal. Electronics associated with the photodetector can be used to shape and digitize the electronic signal.

Referring now to FIG. 16, in some embodiments, the presently disclosed subject matter provides an apparatus 10 for detecting radiation wherein the apparatus comprises a photon detector 12 and a scintillator material 14 (i.e., a codoped GGAG single crystal, polycrystalline and/or ceramic material, such as, but not limited to GGAG:Ce,B, GGAG:Ce,Ca, and GGAG:Ce,B). Scintillator material 14 can convert radiation to light that can be collected by a CCD or a PMT or other photon detector 12 efficiently and at a fast rate.

Referring again to FIG. 16, photon detector 12 can be any suitable detector or detectors and can be optically coupled to the scintillator (i.e., the codoped GGAG) for producing an electrical signal in response to emission of light from the scintillator. Thus, photon detector 12 can be configured to convert photons to an electrical signal. Electronics associated with photon detector 12 can be used to shape and digitize the electronic signal. Suitable photon detectors 12 include, but are not limited to, photomultiplier tubes, photodiodes, CCD sensors, and image intensifiers. Apparatus 10 can also include electronics 16 for recording and/or displaying the electronic signal.

In some embodiments, the radiation detector is configured for use as part of a medical or veterinary diagnostic device, a device for oil or other geological exploration (e.g., oil well logging probes), or as a device for detecting radiation for security and/or military-related purposes (e.g., as a device for container, vehicle, or baggage scanning or for scanning humans or other animals). In some embodiments, the medical or veterinary diagnostic device is selected from, but not limited to, a positron emission tomography (PET) device, an X-ray computed tomography (CT) device, a single photon emission computed tomography (SPECT) device, or a planar nuclear medical imaging device. For example, the radiation detector can be configured to move (e.g., via mechanical and/or electronic controls) over and/or around a sample, such as a human or animal subject, such that it can detect radiation emitted from any desired site or sites on the sample. In some embodiments, the detector can be set or mounted on a rotating body to rotate the detector around a sample.

In some embodiments, the device can also include a radiation source. For instance, an X-ray CT device of the presently disclosed subject matter can include an X-ray source for radiating X-rays and a detector for detecting said X-rays. In some embodiments, the device can comprise a plurality of radiation detectors. The plurality of radiation detectors can be arranged, for example, in a cylindrical or other desired shape, for detecting radiation emitted from various positions on the surface of a sample.

In some embodiments, the presently disclosed subject matter provides a method for detecting radiation using a radiation detector comprising a codoped garnet-type scintillator as described hereinabove. Thus, in some embodiments, the presently disclosed subject matter provides a method of detecting gamma rays, X-rays, cosmic rays and/or particles having an energy of 1 keV or greater, wherein the method comprises using a radiation detector comprising a material of the formula:

wherein:
  R is Y or Lu;
  D is at least one trivalent dopant ion;
  E is at least one codopant ion;
  $0 \leq x \leq 2$;
  $0.0001 \leq y \leq 0.15$;
  $0.0001 \leq z \leq 0.15$;
  $1 \leq s \leq 4.0$; and
  wherein said material is a single crystal, polycrystalline, and/or ceramic material. In some embodiments, D can be, for example, selected from the group comprising, but not limited to, $Ce^{3+}$, $Pr^{3+}$, $Nd^{3+}$, $Sm^{3+}$, $Eu^{3+}$, $Dy^{3+}$, $Ho^{3+}$, $Er^{3+}$, and $Tm^{3+}$. In some embodiments, the at least one trivalent dopant ion is $Ce^{3+}$ or $Pr^{3+}$.

E can be ions of elements, such as, but not limited to, Ba, B, Ca, Fe, Bi, Cr, Zn, Ag, Nb, K, Na, Sr, and Cu. In some embodiments, the codopant E is an ion of an element other than any one or more of Mg, Zr, Sc, Hf, Si, Ge, Ti, or Ni. In some embodiments, the at least one codopant is $Ca^{2+}$, $B^{3+}$, or $Ba^{2+}$. In some embodiments, the at least one codopant is $Ca^{2+}$ or $Ba^{2+}$.

In some embodiments, x is between 0 and about 1. In some embodiments, x is 0 and the only rare-earth element in the main garnet matrix is Gd. In some embodiments, s is about 2 or about 3. In some embodiments, x is 0 and s is 2 or 3.

In some embodiments, the activator/dopant ion is provided at between about 0.1 and about 0.5 atomic % (e.g., relative to the content of the rare earth elements (Gd+R) in the main garnet matrix). Thus, in some embodiments, y is between about 0.003 and about 0.015. In some embodiments, the activator/dopant ion is provided at about 0.2 atomic %. Thus, in some embodiments, y is about 0.006.

In some embodiments, the codopant is provided at between about 0.1 and about 0.5 atomic % (e.g., relative to the content of the rare earth element (Gd+R) in the main garnet matrix). Thus, z can be between about 0.003 and about 0.015. In some embodiments, the codopant is provided at between about 0.2 and about 0.4 atomic % relative to the rare-element in the main garnet matrix. Thus, in some embodiments, z can be between about 0.006 and about 0.012.

In some embodiments, the ratio of dopant ion to codopant ion is between about 10:1 and about 1:10. In some embodiments, the ratio is between about 2:1 and about 1:3. In some embodiments, the ratio is between about 1:1 and about 1:2.

In some embodiments, the scintillator for the radiation detector is a single crystal material. In some embodiments, the scintillator can be polycrystalline and/or ceramic.

In some embodiments, the presently disclosed subject matter provides a device comprising a photodetector and a cerium doped GGAG (e.g., $Gd_3Ga_3Al_2O_{12}$ or $Gd_3Ga_2Al_3O_{12}$), wherein the cerium doped GGAG is co-doped with a codopant ion. In some embodiments, the codopant ion is selected from the group comprising $Ca^{2+}$, $B^{3+}$, and $Ba^{2+}$. Thus, in some embodiments, the device comprises GGAG:Ce,Ca. In some embodiments, the device comprises GGAG:Ce,B. In some embodiments, the device comprises GGAG:Ce,Ba. In some embodiments, the device comprises cerium doped $Gd_3Ga_3Al_2O_{12}$ or $Gd_3Ga_2Al_3O_{12}$, wherein the cerium doped $Gd_3Ga_3Al_2O_{12}$ or $Gd_3Ga_2Al_3O_{12}$ is codoped with a codopant ion.

In some embodiments, the codoped cerium doped GGAG is prepared from a melt. In some embodiments, the codoped cerium doped GGAG is a single crystal or ceramic.

In some embodiments, the device comprising the photodetector and the codoped cerium doped GGAG is adapted for use in medical imaging, geological exploration, or homeland security. In some embodiments, the presently disclosed subject matter provides a method of detecting high energy photons and particles, wherein the method comprises using the device comprising the photodetector and the codoped cerium doped GGAG.

V. Methods of Preparation

In some embodiments, the presently disclosed subject matter provides a method of preparing a codoped garnet-type scintillator material. In some embodiments, the presently disclosed subject matter provides a method for preparing a scintillator material that comprises preparing a crystal from a melt. For instance, in some embodiments, the codoped garnet-type scintillator material can be a crystal grown by the Czochralski (pulling-up) method. However, single crystals or polycrystalline materials and/or ceramics grown or produced by other methods can also be used as a scintillator material according to the present disclosure. For example, alternative methods for producing garnet-type materials include, but are not limited to the micro-pulling down method, Bridgman method, zone melt method, Edge-defined Film-fed Growth (EFG) method, and hot isostatic press (HIP) sintering method.

In any production method of crystals, an oxide or carbonate raw material can be used as a starting material. Thus, suitable starting materials for preparing the crystals include, but are not limited to, $Gd_2O_3$, $\beta$-$Ga_2O_3$, $\alpha$-$Al_2O_3$, $CeO_2$, $Pr_6O_3$, $Lu_2O_3$, and the like. When the crystal is used as a crystal for a scintillator, a high-purity raw material (e.g., having a purity of 99.99% or higher and/or not containing more than 1 ppm of an impurity) can be used. These starting materials can be weighed and mixed such that a desired composition is obtained at the time of forming a melt.

In some embodiments, the Czochralski technique (in which large single crystals are "pulled" from molten raw material) can be used to grow codoped rare-earth gallium crystal boules. Raw materials (e.g., $Gd_2O_3$, $Al_2O_3$, $Ga_2O_3$, cerium salt (e.g., cerium nitrate), etc.) can be measured out and mixed, e.g., using a ball mill, etc., and the mixed powder placed into a crucible. Calcination can be performed at, for example, 1000 to 1700 degrees Celsius for several hours. Suitable crucible materials include platinum, iridium, rhodium, rhenium, and alloys thereof. A high frequency oscillator, a condensing heater, or a resistance heater can be used. Further, a flowing atmosphere of argon, helium, or nitrogen can be used. In some embodiments, an atmosphere of nitrogen with a small amount of oxygen (e.g., between about 0.1 to about 5 vol %) can be used.

In some embodiments, the presently disclosed materials can be provided as ceramics, for example, by using a hot press or hot isotatic press (HIP) method. In this method, the raw materials (e.g., $Gd_2O_3$, $Al_2O_3$, $Ga_2O_3$, cerium salt (e.g., cerium nitrate), etc.) can be measured out and mixed, e.g., using a ball mill, etc. Then the mixed powders can be put into a crucible (e.g., an alumina crucible) and calcination can be performed (e.g., at a temperature of 1200 to 1500 degrees Celsius) for several hours. In the case of the hot press method, after the calcination, press molding can be performed to get a formed object using a die, after granulating the powder using a sieve with a suitable aperture. Then, the formed object can be set to a carbon die, and hot press sintering can be performed in an inert gas atmosphere at, for example, 1500 to 1700 degrees Celsius and at a pressure of 10 MPa to 80 MPa. In the case of the HIP method, calcination powder is ground using a ball mill etc., and press molding can be performed to get a formed object using a die. The obtained formed object can be densified by a cold isostatic press method, put into a sagger made of alumina, and calcination carried out at a temperature of, for example, 1500 to 1700 degrees Celsius, in an inactive gas atmosphere. HIP sintering can be further performed to the obtained ceramics at a pressure of 50 MPa or higher, and at a temperature of 1300 to 1700 degrees Celsius.

In some embodiments, the presently disclosed subject matter provides a method of preparing a material comprising:

$$Gd_{3-x-y-z}R_xD_yE_zAl_{5-s}Ga_sO_{12},$$

wherein:
R is Y or Lu;
D is at least one trivalent dopant ion;
E is at least one codopant ion;
$0 \leq x \leq 2$;
$0.0001 \leq y \leq 0.15$;
$0.0001 \leq z \leq 0.15$; and
$1 \leq s \leq 4.0$;
wherein the method comprises preparing a preparing a crystal (e.g., a single crystal) from a melt.

In some embodiments, D can be, for example, selected from the group comprising, but not limited to, $Ce^{3+}$, $Pr^{3+}$, $Nd^{3+}$, $Sm^{3+}$, $Eu^{3+}$, $Dy^{3+}$, $Ho^{3+}$, $Er^{3+}$, and $Tm^{3+}$. In some embodiments, the at least one trivalent dopant ion is $Ce^{3+}$ or $Pr^{3+}$. E can be ions of elements, such as, but not limited to, Ba, B, Ca, Fe, Bi, Cr, Zn, Ag, Nb, K, Na, Sr, and Cu. In some embodiments, the codopant E is an ion of an element other than any one or more of Mg, Zr, Sc, Hf, Si, Ge, Ti, or Ni. In some embodiments, the at least one codopant is $Ca^{2+}$, $B^{3+}$, or $Ba^{2+}$. In some embodiments, the at least one codopant is $Ca^{2+}$ or $Ba^{2+}$.

In some embodiments, x is between 0 and about 1. In some embodiments, x is 0 and the only rare-earth element in the main garnet matrix is Gd. In some embodiments, s is about 2 or about 3. In some embodiments, x is 0 and s is 2 or 3.

In some embodiments, the activator/dopant ion is provided at between about 0.1 and about 0.5 atomic % (e.g., relative to the content of the rare earth elements (Gd+R) in the main garnet matrix). Thus, in some embodiments, y is between about 0.003 and about 0.015. In some embodiments, the activator/dopant ion is provided at about 0.2 atomic %. Thus, in some embodiments, y is about 0.006.

In some embodiments, the codopant is provided at between about 0.1 and about 0.5 atomic % (e.g., relative to the content of the rare earth element (Gd+R) in the main garnet matrix). Thus, z can be between about 0.003 and about 0.015. In some embodiments, the codopant is provided at between about 0.2 and about 0.4 atomic % relative to the rare-element in the main garnet matrix. Thus, in some embodiments, z can be between about 0.006 and about 0.012.

In some embodiments, the ratio of dopant ion to codopant ion is between about 10:1 and about 1:10. In some embodiments, the ratio is between about 2:1 and about 1:3. In some embodiments, the ratio is between about 1:1 and about 1:2.

In some embodiments, the presently disclosed subject matter provides a method of preparing a composition comprising cerium doped GGAG, wherein the cerium doped GGAG is co-doped with a codopant ion, wherein the method comprises preparing a crystal (e.g., a single crystal) from molten raw materials. In some embodiments, the method comprise preparing a composition comprising cerium doped $Gd_3Ga_3Al_2O_{12}$ or $Gd_3Ga_2Al_3O_{12}$, wherein the cerium doped $Gd_3Ga_3Al_2O_{12}$ or $Gd_3Ga_2Al_3O_{12}$ is co-doped with a codopant ion, and wherein the method comprises preparing (e.g., pulling) a crystal (e.g., a single crystal) from molten raw materials.

VI. Methods of Altering Scintillation and/or Optical Properties

In some embodiments, the presently disclosed subject matter provides a method of altering one or more scintillation and/or optical properties of a garnet-type scintillation material, such as, but not limited to, scintillation light yield, decay time, rise time, energy resolution, proportionality, and sensitivity to light exposure. In some embodiments, the method comprises preparing the scintillation material in the presence of a dopant ion and one or more codopant ions. In some embodiments, the garnet-type scintillation material is a rare-earth gallium aluminum garnet. In some embodiments, the garnet-type scintillation material is a gadolinium gallium aluminum garnet.

The dopant ion can be a trivalent ion, for instance, a trivalent rare earth element ion. In some embodiments, the dopant ion is $Ce^{3+}$ or $Pr^{3+}$. The identity of the codopant can be varied depending upon the composition of the garnet scintillator and the scintillation properties desired. In some embodiments, the codopant ion is not an ion of an element selected from the group comprising Sc, Mg, Ni, Ti, Zr, Hf, Si, and Ge (or any single one or sub-combination thereof). In some embodiments, the codopant ion is an ion of an element selected from the group comprising Ba, B, Ca, Fe, Bi, Cr, Zn, Ag, Nb, Sr, K, Na, and Cu. In some embodiments, the codopant is an ion of an element selected from the group comprising Ca, B, and Ba. In some embodiments, the codopant ion is $Ca^{2+}$. In some embodiments, the codopant ion is $B^{3+}$. In some embodiments, the codopant ion is $Ba^{2+}$.

In some embodiments, the method comprises preparing a single crystal rare-earth gallium aluminum garnet-type scintillator. In some embodiments, the method comprises: (a) forming a mixture for the growth of the garnet-type scintillator, wherein forming said mixture comprises providing a predetermined amount of a dopant ion and a predetermined amount of at least one codopant ion; (b) melting said mixture to form a melt; and (c) growing a crystal from said melt, thereby obtaining a codoped single crystal garnet-type scintillator.

In some embodiments, the dopant ion is $Ce^{3+}$ and the codopant is $Ca^{2+}$, and the method provides a rare-earth gallium aluminum garnet-type scintillator that exhibits one or more of faster decay time, shorter rise time, or reduced light sensitivity as compared to a non-codoped rare-earth gallium aluminum garnet type scintillator. In some embodiments, the dopant ion is $Ce^{3+}$ and the codopant is $Ba^{2+}$, and the method provides a rare-earth gallium aluminum garnet-type scintillator that exhibits increased light yield compared to a non-codoped rare-earth gallium aluminum garnet type scintillator. In some embodiments, the dopant ion is $Ce^{3+}$ and the codopant is $B^{3+}$, and the method provides a rare-earth gallium aluminum garnet-type scintillator that exhibits one or more of better energy resolution, increased light yield, longer decay time, shorter rise time, better proportionality, and reduced light sensitivity compared to a non-codoped rare-earth gallium aluminum garnet type scintillator.

In some embodiments, the method further comprises annealing the codoped single crystal garnet-type scintillator. The annealing can be performed, for example, in air, nitrogen, or a mixture of nitrogen and hydrogen. The annealing can be done at any suitable temperature, e.g., between about 800 and about 1600 degrees Celsius (e.g., about 800, 900, 1000, 1100, 1200, 1300, 1400, 1500, and about 1600 degrees Celsius).

In some embodiments, the method further comprises exposing the scintillator material to light or dark for a period of time (i.e., prior to use of the material as a scintillator).

In some embodiments, the presently disclosed subject matter provides a method of altering one or more scintillation and/or optical properties of a cerium doped GGAG scintillator material, the method comprising preparing the cerium doped GGAG scintillator material in the presence of a codopant ion, thereby providing the codoped GGAG scintillator. In some embodiments, the method provides for altering one or more scintillation and/or optical properties of a cerium doped $Gd_3Ga_3Al_2O_{12}$ or $Gd_3Ga_2Al_3O_{12}$ scintillator material, the method comprising preparing the cerium doped $Gd_3Ga_3Al_2O_{12}$ or $Gd_3Ga_2Al_3O_{12}$ scintillator material in the presence of a codopant ion, thereby providing a codoped $Gd_3Ga_3Al_2O_{12}$ or $Gd_3Ga_2Al_3O_{12}$ scintillator material. In some embodiments, the codopant is selected from the group comprising $Ca^{2+}$, $B^{3+}$, and $Ba^{2+}$. In some embodiments, the codoped GGAG scintillator (e.g., the codoped $Gd_3Ga_3Al_2O_{12}$ or $Gd_3Ga_2Al_3O_{12}$ scintillator) is a single crystal and the method comprises: (a) forming a melt for the growth of the cerium doped GGAG scintillator material (e.g., the cerium doped $Gd_3Ga_3Al_2O_{12}$ or $Gd_3Ga_2Al_3O_{12}$ scintillator material); (b) adding a co-dopant to the melt; and (c) pulling or otherwise obtaining a crystal from said melt.

In some embodiments, the codopant ion is $Ca^{2+}$, and the method provides a codoped GGAG scintillator (e.g., a codoped $Gd_3Ga_3Al_2O_{12}$ or $Gd_3Ga_2Al_3O_{12}$ scintillator) that exhibits one or more of faster decay, shorter rise time, or reduced light sensitivity as compared to a non-codoped GGAG scintillator (e.g., a non-codoped $Gd_3Ga_3Al_2O_{12}$ or $Gd_3Ga_2Al_3O_{12}$ scintillator). In some embodiments, the codopant ion is $Ba^{2+}$, and the method provides a codoped GGAG scintillator (e.g., a codoped $Gd_3Ga_3Al_2O_{12}$ or $Gd_3Ga_2Al_3O_{12}$ scintillator) that exhibits increased light yield compared to a non-codoped GGAG scintillator. In some embodiments, the codopant ion is $B^{3+}$, and the method provides a codoped GGAG scintillator (e.g., a codoped $Gd_3Ga_3Al_2O_{12}$ or $Gd_3Ga_2Al_3O_{12}$ scintillator) that exhibits one or more of better energy resolution, increased light yield, longer decay time, shorter rise time, better proportionality, and reduced light sensitivity compared to a non-codoped GGAG scintillator.

In some embodiments, the method further comprises annealing the codoped GGAG scintillator (e.g., the codoped $Gd_3Ga_3Al_2O_{12}$ or $Gd_3Ga_2Al_3O_{12}$ scintillator material). In some embodiments, the annealing can be performed in air, nitrogen, or a mixture of nitrogen and hydrogen.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Example 1

General Methods

Crystal Growth:

Crystals were grown via the Czochralski method. More particularly, the crystals were grown in inductively heated iridium crucibles in a Cyberstar Oxypuller Czochralski growth station (Cyberstar, Echirolles, France) under a flowing nitrogen atmosphere with a small fraction of a percent oxygen. Dopant and codopant concentrations are referenced herein refer to the initial starting melt and are given with respect to the rare earth element ion (e.g., to $Gd^{3+}$, when the crystal is $Gd_3Ga_3Al_2O_{12}$). In some embodiments, the initial starting melt contained 0.2 atomic percent of the dopant. The concentrations in the finished boules can differ from that in the melt due to segregation at the solid-liquid interface. Excess $Ga_2O_3$ can be added to the melt to account for losses of Ga due to vaporization. See Donnald et al., 2013. Samples were taken from similar positions in each boule to ensure consistent dopant concentration. If desired, the dopant and/or codopant ion concentration can be determined in a finished sample using, for example, Glow Discharge Mass Spectrometry (GDMS).

Characterization of the crystals was carried out according to methods described in more detail elsewhere. See e.g., Donnald et al., 2013; Tyagi et al., 2013a; and Tyagi et al.; 2013b. Briefly, transmission spectra were measured with a Varian Cary 5000 UV-Vis-NIR spectrophotometer (Agilent Technologies, Santa Clara, Calif., United States of America). Low temperature emission and excitation spectra were measured with a HORIBA Jobin Yvon Fluorolog-3 spectrofluorometer (Horiba, Ltd., Kyoto, Japan). An Advanced Research Systems (ARS) DE-202AE closed cycle helium cryostat system (Advanced Research Systems, Macungie, Pa., United States of America) was used to control the sample cooling. For emission and excitation spectra, a 450 W continuous xenon lamp was used as the excitation source. For photoluminescence (PL), HORIBA Jobin Yvon NanoLEDs (pulsed light-emitting diodes; Horiba, Ltd., Kyoto, Japan) were used as the excitation source. For radioluminescence (RL) measurements, an x-ray tube was used as the excitation source.

Light Yield and Energy Resolution Measurements: Light yield and energy resolution measurements were performed as described elsewhere. See Donnald et al., 2013; Tyagi et al., 2013a; and Tyagi et al., 2013b. Briefly, absolute light output (LO) and energy resolution measurements were made on 5×5×5 $mm^3$ samples using a pulse processing chain comprising a R2059 photomultiplier tube (PMT; Hamamatsu Photonics, Hamamatsu, Japan), an Ortec® 672 amplifier (Advanced Measurement Technology, Inc., Oak Ridge, Tenn., United States of America), a Canberra 2005 pre-amplifier (Canberra Industries, Inc., Meridan, Conn., United States of America), and a Tukan 8 k multichannel analyzer (MCA; National Center for Nuclear Research, Świerk, Poland). The PMT was directly coupled to each sample via optical grease, and a hemispherical SPECTRALON® reflector (Labsphere, North Sutton, N.H., United States of America) was used to maximize collection of light. Relative LO measurements were conducted with bismuth germanate (BGO) reference crystals. Samples were irradiated with a $^{137}Cs$ source

Example 2

Effects of Codoping on Light Output and Decay Time

The effects of codoping on light output and decay time were measured for calcium, boron, and barium codoped cerium doped GGAG (GGAG:Ce) single crystals and compared to that of GGAG:Ce without a codopant. The exemplary GGAG $Gd_3Ga_3Al_2O_{12}$ was used as the main matrix material unless otherwise noted. Also unless otherwise noted, the codopant was present in the initial melt for preparing the codoped crystal at 0.2 atomic % (with respect to Gd) and the amount of Ce present in the initial melt was also 0.2 atomic % (with respect to Gd).

Figure 2:
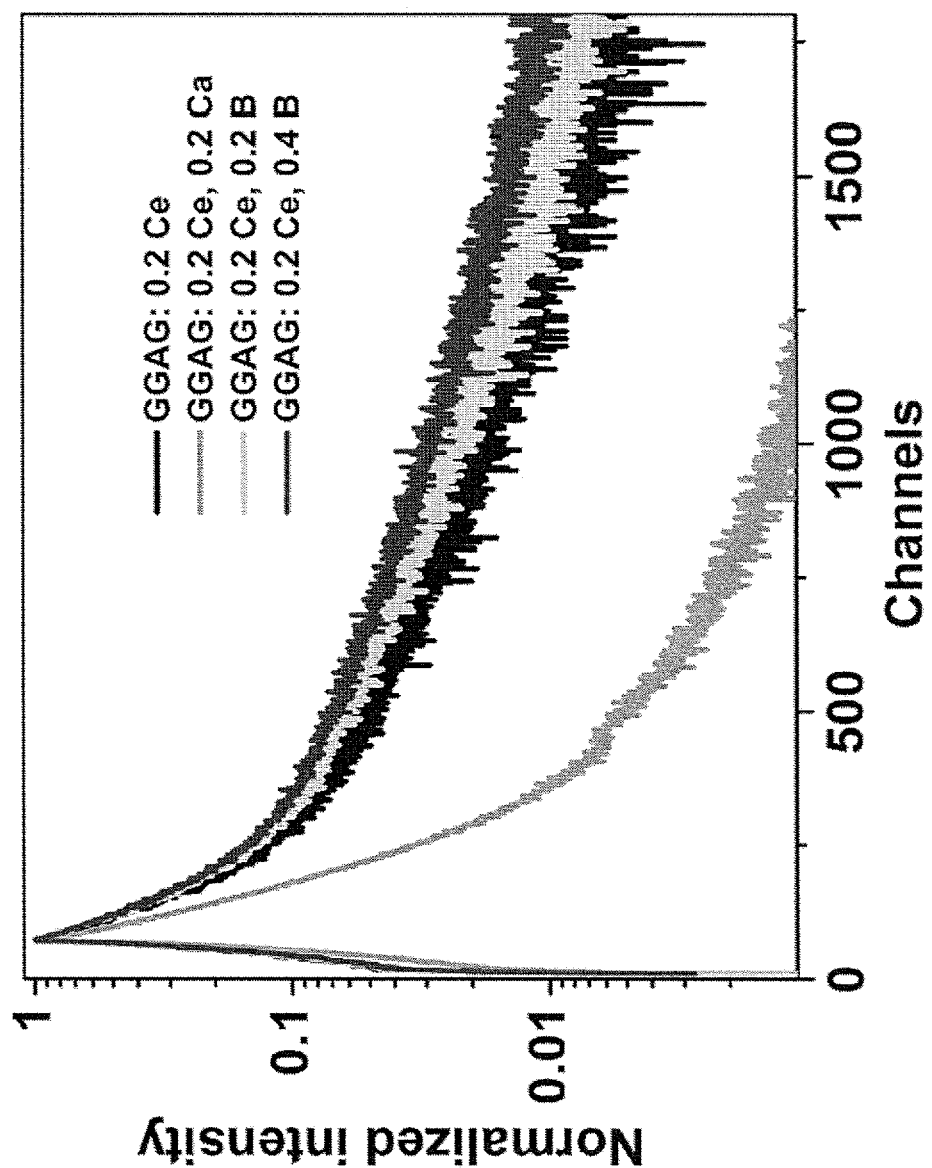
FIG. 2 is a graph showing the effect of calcium (Ca) and boron (B) codoping on room temperature scintillation decay and rise time in cerium doped gadolinium gallium aluminum garnet (GGAG)-type scintillators. Data is shown for a 0.2 atomic % cerium doped GGAG crystal codoped with 0.2 atomic % calcium (GGAG: 0.2 Ce, 0.2 Ca; medium grey line); a 0.2 atomic % cerium doped GGAG crystal codoped with 0.2 atomic % boron (GGAG: 0.2 Ce, 0.2 B, light grey line); and a 0.2 atomic % cerium doped GGAG crystal codoped with 0.4 atomic % boron (GGAG: 0.2 Ce, 0.2 B, dark grey line). Light output for a 0.2 atomic % cerium doped GGAG crystal (GGAG: 0.2 Ce, black line) without a codopant is shown for comparison. All dopant and codopant atomic percentages are relative to gadolinium (Gd) in the initial melt from which the crystals were grown. Channels (x axis) are proportional to time.

The relative scintillation LO measured for the different codoped samples is shown in FIG. 1. The highest LO results from B codoping, while Ca codoping reduces LO. Ba codoping can also increase LO. B codoping was also found to provide better energy resolution. FIG. 2 shows the effects of Ca and B codoping on room temperature scintillation decay and rise time. Data for B codoping at both 0.2 and 0.4 atomic % is provided. Both codopants have modified kinetics, but in different ways. Ca codoping shortens the decay time, while B lengthens it. Both Ca and B shortened the rise time. Thus, it appears that calcium codoping can provide a faster decay time, albeit at the expense of light yield.

Example 3

Effects of Codoping on Light Yield Non-Proportionality

Figure 3:
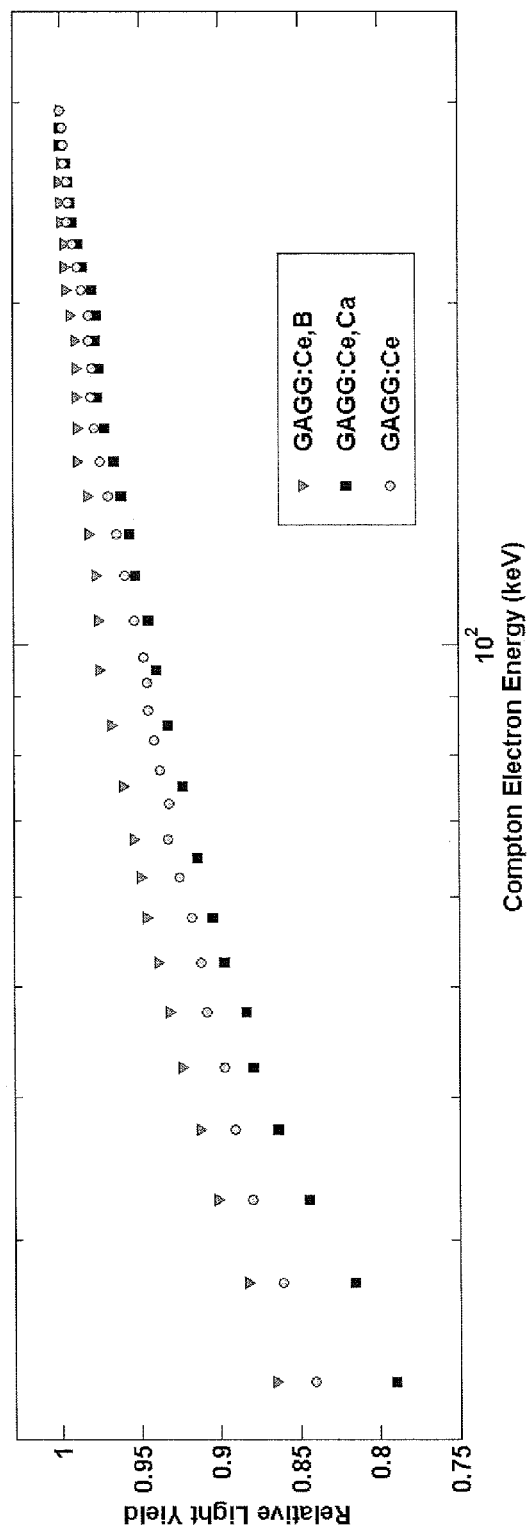
FIG. 3 is a graph showing the effect of calcium (Ca) and boron (B) codoping on energy dependence of relative light yield in cerium (Ce) doped gadolinium gallium aluminum garnet (GGAG)-type scintillators. Data for a B codoped Ce doped GGAG (GGAG:Ce,B) is shown in grey shaded triangles. Data for a Ca codoped Ce doped GGAG (GGAG:Ce,Ca) is shown in black squares. Data for a Ce doped GGAG (GGAG:Ce, grey shaded circles) without a codopant is shown for comparison. All samples are normalized to 1 at 305 kiloelectronvolts (keV).

In scintillation material development, a goal is to provide a material wherein the number of scintillation photons are directly proportional to the energy deposited in the material. In practice, however, inorganic scintillators generally exhibit some degree of light yield nonproportionality. The presently disclosed GGAG:Ce samples displayed a similar trend, with their light output decreasing disproportionately at lower energies. As indicated in FIG. 3, the addition of boron to GGAG:Ce appears to have an overall positive effect on the proportionality of the light yield. In contrast, the addition of calcium appears to have a negative impact on light yield proportionality.

Example 4

Effects of Codoping on Light Sensitivity

Sensitivity to light exposure can be a desirable quality when it comes to manufacturability of scintillator-based detectors. GGAG crystals exhibit defects such as room temperature trap centers, which can cause the material to be sensitive to light. Changes in light sensitivity can be shown using annealing studies, in which samples are heated while surrounded by different atmospheres. Examples include heating in a vacuum versus heating at atmospheric pressure, or heating in air (oxidizing) versus heating in nitrogen (neutral) or nitrogen plus hydrogen (reducing).

Figure 4:
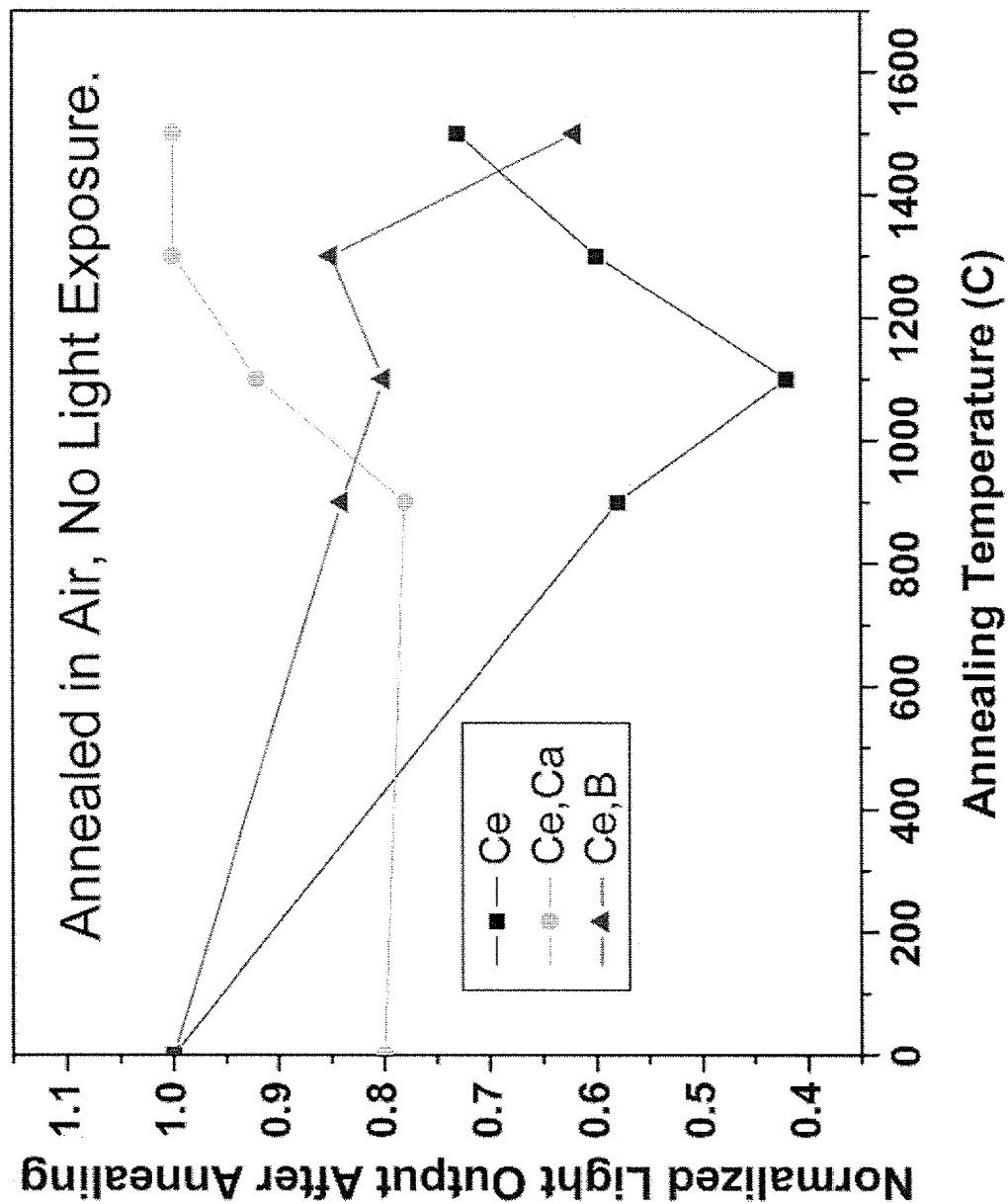
FIG. 4 is a graph showing the effect of calcium (Ca) and boron (B) codoping on post-annealing normalized light output (LO) in cerium doped gadolinium gallium aluminum garnet (GGAG)-type scintillators. Cerium only doped (Ce; black squares) and Ca (Ce,Ca; light grey shaded circles) and B (Ce,B; dark grey shaded triangles) codoped cerium doped GGAG scintillators were annealed in air at four different temperatures as indicated on the x axis, and the LO was subsequently measured without exposing the GGAG scintillators to ambient light.

Codoped GGAG:Ce samples were heated in different atmospheres at different temperatures. FIG. 4 shows the effect of codoping on post-anneal light yield in GGAG:Ce; GGAG:Ce,Ca; and GGAG:Ce,B samples annealed in air at four different temperatures. The light yield was subsequently measured without exposing the samples to ambient light. Annealed crystals which have been protected from light exposure prior to measurement have modified post-anneal light yield and the codoped crystals behave differently than Ce-only doped crystals.

Figure 5:
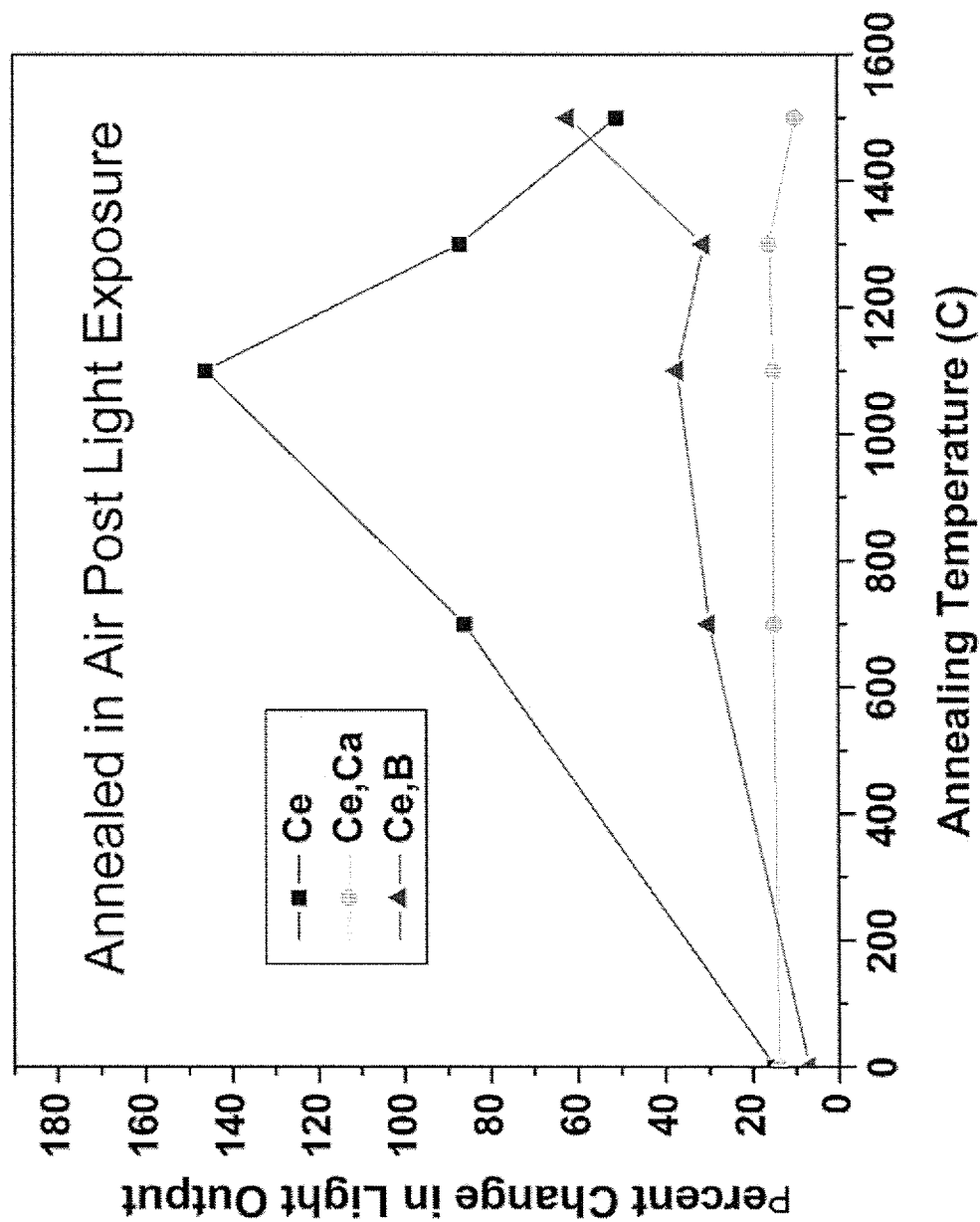
FIG. 5 is a graph showing the effect of calcium (Ca) and boron (B) codoping on light sensitivity (as indicated by percent (%) change in light output (LO)) in cerium doped gadolinium gallium aluminum garnet (GGAG)-type scintillators. Cerium doped only (Ce; black squares) and Ca (Ce,Ca; light grey shaded circles) and B (Ce,B; dark grey shaded triangles) codoped cerium doped GGAG scintillators were annealed in air at four different temperatures as indicated on the x axis, and then briefly exposed to ambient light prior to measuring light output.

FIG. 5 shows the effect of codoping on samples annealed in air at four different temperatures and then exposed to light prior to measuring the light yield. Codoping had a clear and measurable effect on the scintillator's light sensitivity, as separate and distinct from the effect on any other annealing properties. Light sensitivity is decreased in Ca codoped crystals. Without being bound to any one theory, it is believed that Ca codoping can suppress defects.

Example 5

Effect of Codoping on Thermoluminescence

Figure 6:
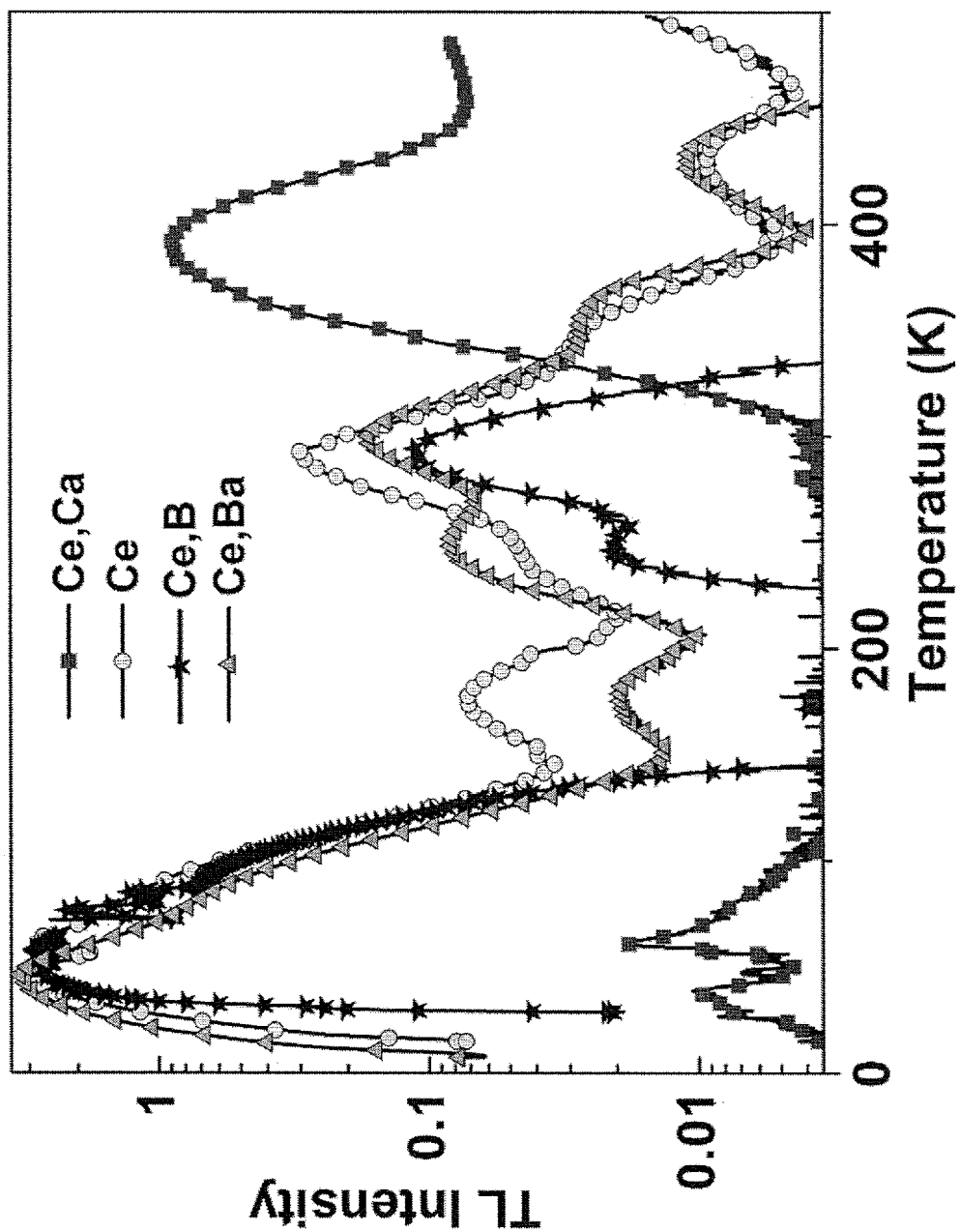
FIG. 6 is a graph showing the effect of calcium (Ca), boron (B) and barium (Ba) codoping on defects and traps (as shown via thermoluminescence (TL) measurements) in cerium doped gadolinium gallium aluminum garnet (GGAG)-type scintillators. Data is shown for a cerium only doped (Ce; light grey shaded circles) and for Ca codoped (Ce,Ca; dark grey shaded squares), B codoped (Ce,B; black stars), and Ba codoped (Ce,Ba; light grey shaded triangles) cerium doped GGAG scintillators.

FIG. 6 shows the results of thermoluminescence measurements of GGAG:Ce; GGAG:Ce,Ca; GGAG:Ce,Ba; and GGAG:Ce,B samples. The glow curves suggest that Ca codoping suppresses deep (low temperature) traps, while B codoping had a more pronounced effect on shallow, room temperature traps.

Figure 7A:
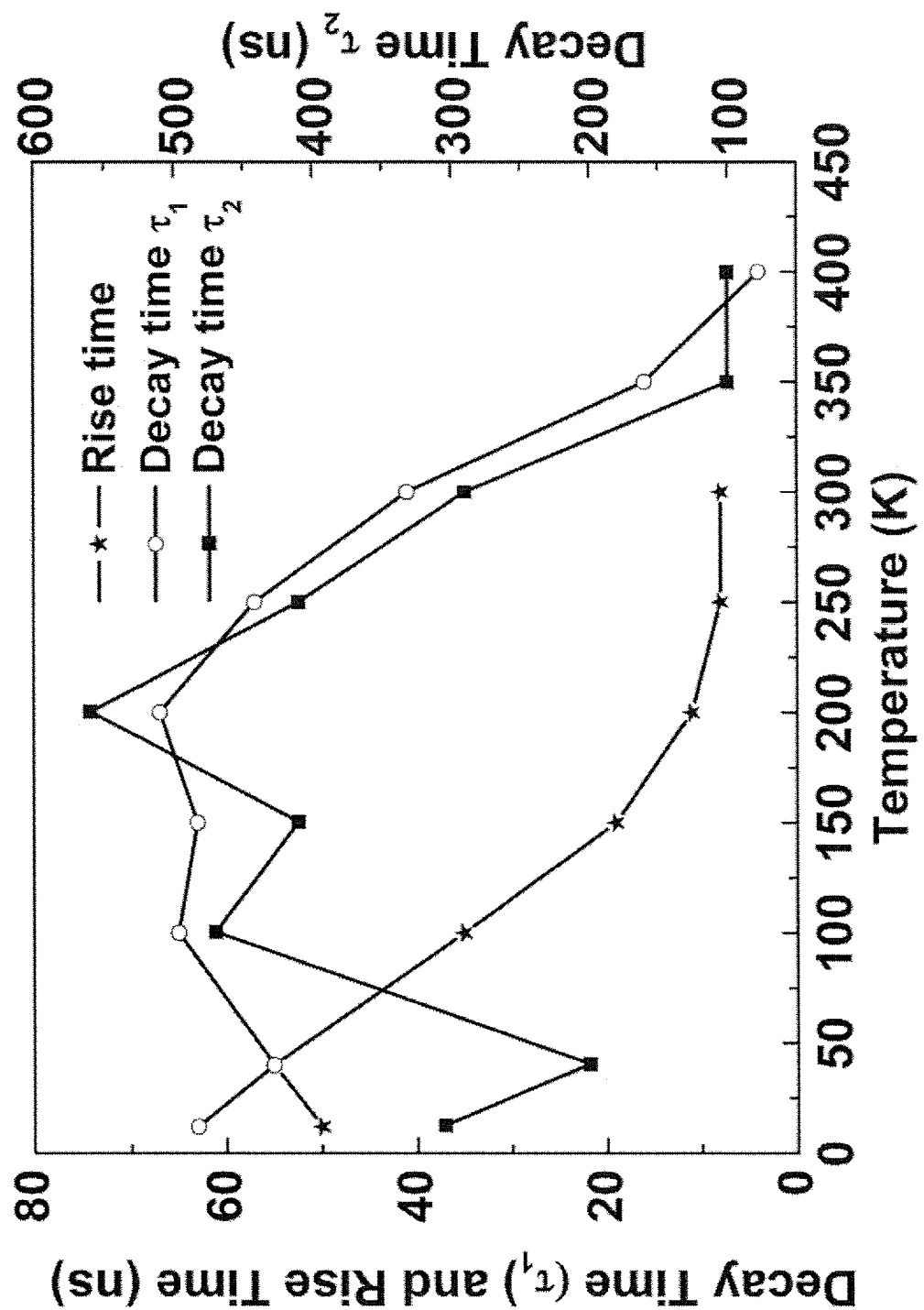
FIG. 7A is a graph showing the decay times ($\tau_1$ and $\tau_2$) and rise time in a cerium only doped gadolinium gallium aluminum garnet (GGAG)-type scintillator over a temperature range of 12 to 300° K. Rise time data is shown by the black stars, while decay time ($\tau_1$) data is shown by open circles and decay time ($\tau_2$) data is shown by black squares.
Figure 7B:
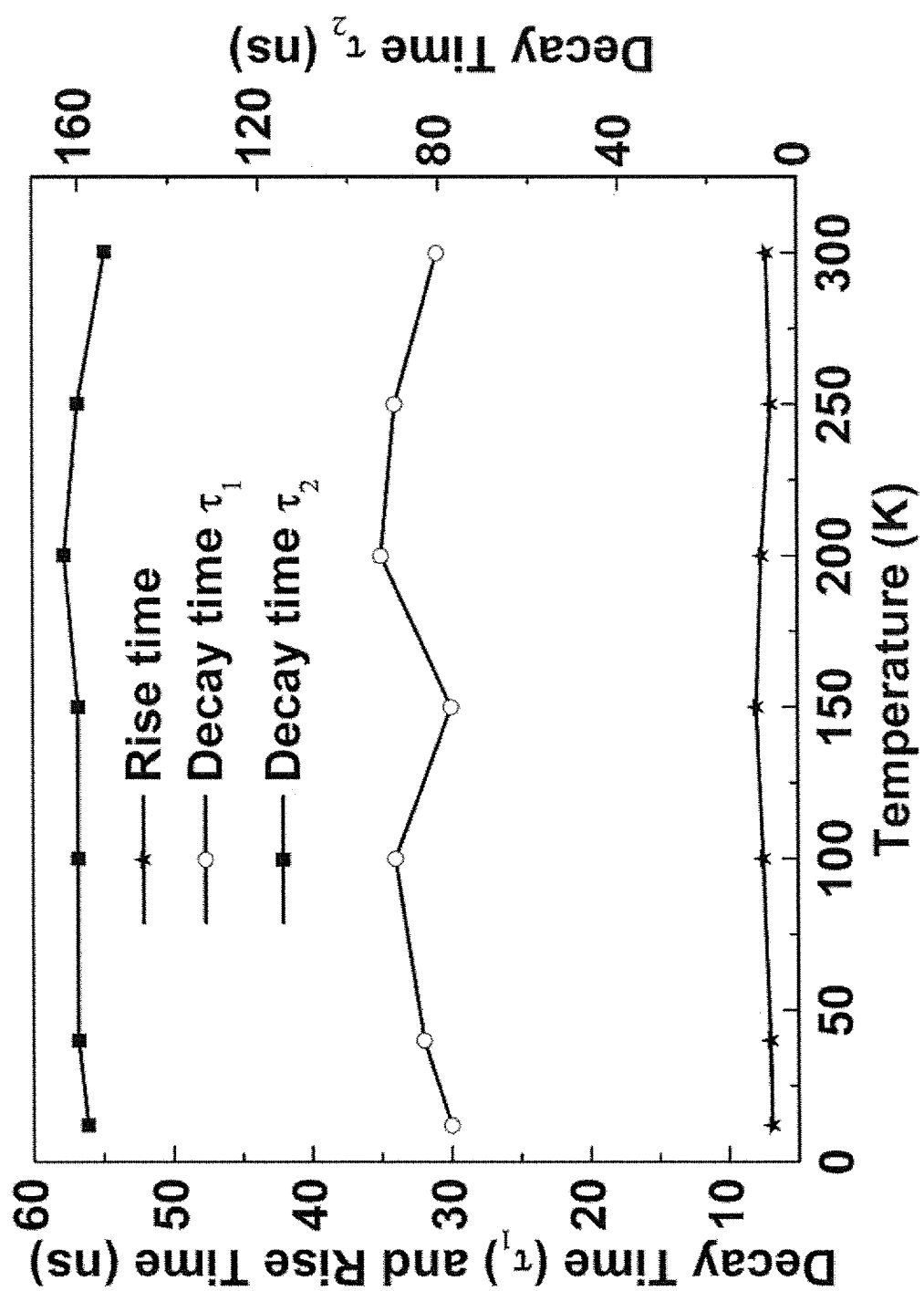
FIG. 7B is a graph showing the decay and rise times in a calcium codoped cerium doped gadolinium gallium aluminum garnet (GGAG)-type scintillator. Rise time data is shown by the black stars, decay time ($\tau_1$) data by the open circles, and decay time ($\tau_2$) data by the black squares.

The significance of this apparent trap suppression can be seen in the temperature dependence of scintillator decay and rise time, as shown in FIGS. 7A and 7B. FIG. 7A shows decay and rise time in Ce-only crystals from 12-300+ degrees K. FIG. 7B shows similar data for a Ca-codoped crystal. The decay and rise times were found to increase with decreasing temperature in the case of the Ce-only crystal, while Ca codoping modifies the kinetics such that decay and rise times are constant with the change in temperature.

In order to obtain a better understanding of the role of trap centers in the temperature dependence of scintillation kinetics, spectrally resolved thermoluminescence properties were also studied for these crystals. The thermally excited emission spectra show a characteristic Ce 5d-4f transition, indicating that electrons are trapped at trap centers and, after thermal release, subsequently recombine with holes trapped at Ce sites. Therefore, it seems that the presence of shallow and room temperature trap centers contribute to scintillation decay and rise time in GGAG:Ce crystals.

Thus, in summary, thermoluminescence spectra indicated that shallow trap centers and room temperature trap centers are suppressed by Ca codoping and that B codoping suppresses room temperature trap centers. Scintillation rise time for GGAG:Ce crystals was found to be dependent on temperature, and decreased from about 60 nanoseconds (ns) to about 8 ns as temperature increased from 10 K to 300 K. With Ca codoping on the other hand, rise time was found to be constant with temperature. The temperature dependence of the longer component of scintillation decay time is also changed by Ca codoping. Without being bound to any one theory, the data suggests both that trap centers play a role in scintillation rise time, and that Ca codoping acts to suppress these traps.

Example 6

Additional Data for Ca, Ba, and B Codoped GGAG:Ce

As described in Tyagi et al., 2013b, the absorption spectra for GGAG:Ce crystals shows main absorption bands at 440 and 340 nm, which can be assigned to the $Ce^{3+}$4f-5d transitions. Sharp bands at 274 and 310 nm can be assigned to transitions of $Gd^{3+}$. Calcium codoping increases absorption at higher energies and suppresses the higher energy absorption band at 340 nm associated with the $Ce^{3+}$4f-5d transitions. Boron and barium codoping showed only a small increase in transmission in the higher energy region. None of the three codopants introduced any additional absorption bands at longer wavelengths in the visible region.

Photoluminescence measurements showed that GGAG: Ce crystals have excitation bands at 340 and 440 nm due to the 4f-5d transition of $Ce^{3+}$ ions. Emission spectra were recorded using monochromatic light at 440 nm. The emission band due to transition from the lowest excited 5d state to the ground 4f state of $Cd^{3+}$ has two bands at 520 and 565 nm. While the positions of the excitation and emission bands was unaffected by codoping, the higher energy excitation band was suppressed by Ca codoping, and slightly intensified by B or Ba codoping. Thermal quenching energy was unaffected by codoping. The fast components of non-exponential PL decay observed for 345 nm excitation and 550 nm emission were 50 ns, 42 ns, and 55 ns for GGAG:Ce, GGAG:Ce,Ca and GGAG:Ce,B, respectively. The slower components of PL decay were measured to be 80 ns for GGAG:Ce and 112 ns for GGAG:Ce,Ca. The decay curve for GGAG:Ce,B and GGAG:Ce,Ba could be fitted by a single exponential decay function only.

Without being bound to any one theory, the data from the absorption, emission, and excitation spectra is believed to be an indication that there was no change in crystal field, band gap, or position of Ce excited state in the codoped samples studied. Thus, in at least these samples, the codoping strategy appears to affect the defect structure rather than cause a crystal field change.

The absolute LO values and the effect of self-absorption on the LO are shown in Table 2, below. Energy resolution was measured from energy spectra. Boron codoping decreased self-absorption and improved energy resolution from 9% to 7.8%. See Tyagi et al., 2013b; and Donnald et al., 2013.

TABLE 1

Absolute LO and Self-Absorption Effects on LO.

| Composition | Absolute LO (photons per MeV) | % LO decrease when sample size increased by 100% |
| --- | --- | --- |
| GGAG:Ce | 47000 | 5 |
| GGAG:Ce, Ca | 32460 | 22 |
| GGAG:Ce, B | 52000 | 3 |
| GGAG:Ce, Ba | 50000 | not measured |

Fitted values of the scintillation rise (TO and decay times ($\tau_1$ and $\tau_2$) measured at room temperature by gamma excitation are described in Table 2. See Tyagi et al., 2013b. All times are in nanoseconds. The values in parentheses for the decay times represent their relative ratios.

TABLE 2

Fitted Values for Scintillation Rise and Decay Times.

| Composition | Scintillation Rise Time, $\tau_r$ | Decay time, $\tau_1$ (R %) | Decay time, $\tau_2$ (R %) |
| --- | --- | --- | --- |
| GGAG:Ce | 8 | 52 (74) | 335 (26) |
| GGAG:Ce, Ca | 6 | 44 (76) | 260 (24) |
| GGAG:Ce, B | 8 | 58 (75) | 350 (25) |
| GGAG:Ce, Ba | 8 | 56 (80) | 330 (20) |

Figure 8A:
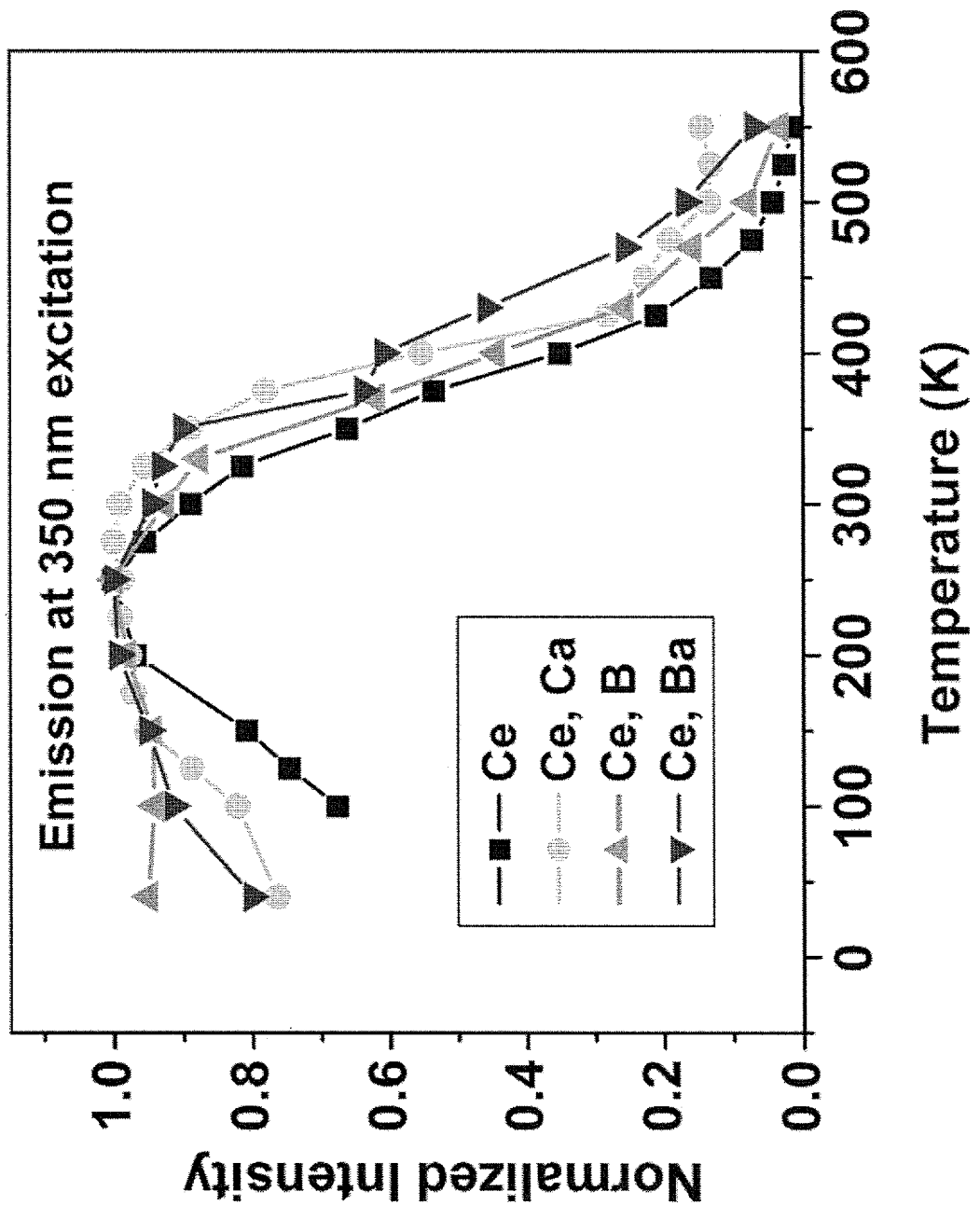
FIG. 8A is a graph showing the temperature dependence of the emission of codoped cerium doped gadolium gallium aluminum garnet (GGAG)-type scintillators after excitation at 350 nm. Data for 0.2 atomic % calcium codoped cerium doped GGAG (Ce,Ca) is shown in light grey shaded circles; data for 0.2 atomic % boron codoped cerium doped GGAG (Ce,B) is shown in medium grey shaded triangles, and data for 0.2 atomic % barium codoped cerium doped GGAG (Ce,Ba) is shown in dark grey shaded triangles. Data for cerium-only doped GGAG (Ce) is shown in black squares for comparison.
Figure 8B:
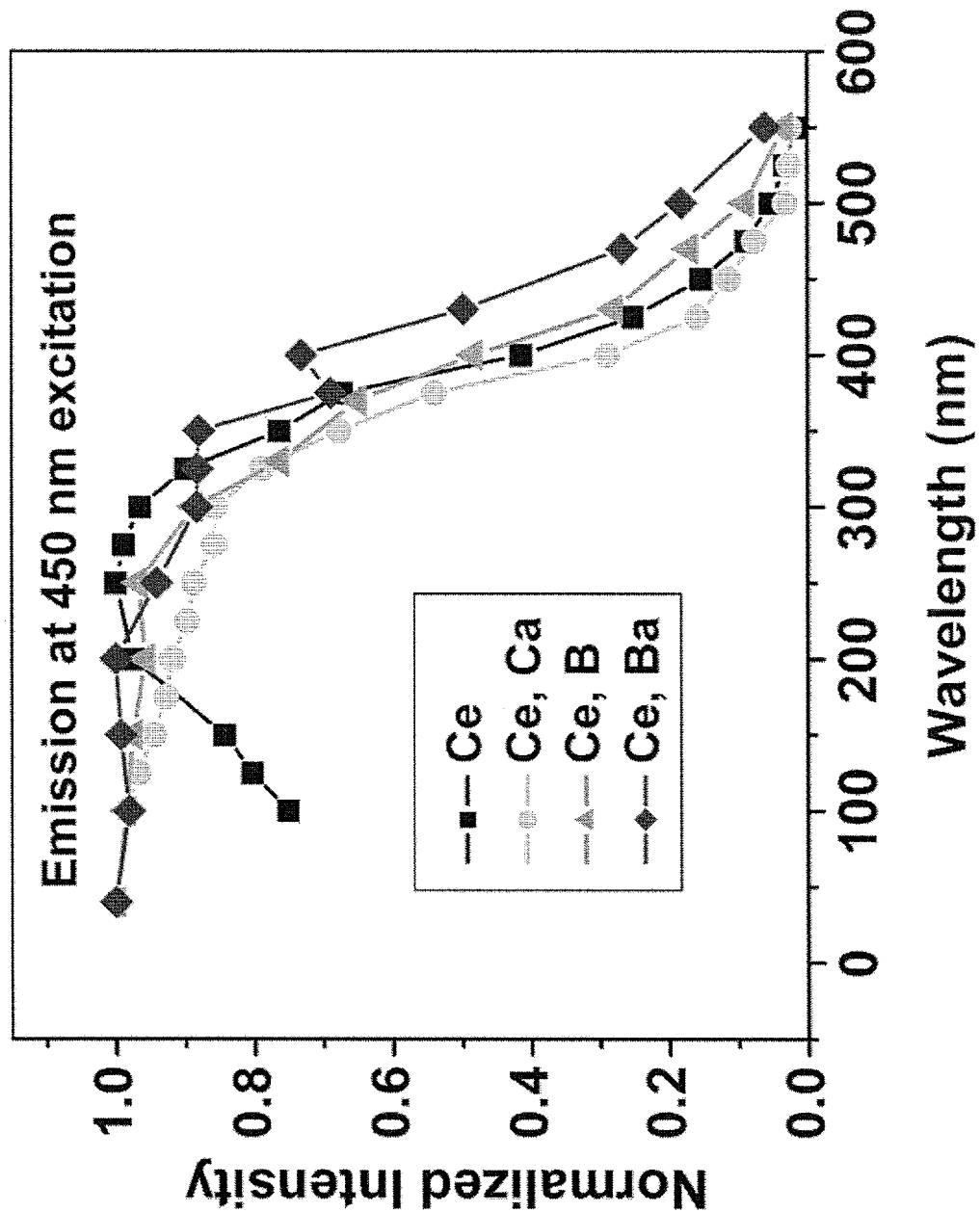
FIG. 8B is a graph showing the temperature dependence of emission of codoped cerium doped gadolium gallium aluminum garnet (GGAG)-type scintillators after excitation at 450 nm. Data for 0.2 atomic % calcium codoped cerium doped GGAG (Ce,Ca) is shown in light grey shaded circles; data for 0.2 atomic % boron codoped cerium doped GGAG (Ce,B) is shown in medium grey shaded triangles; and data for 0.2 atomic % barium codoped cerium doped GGAG (Ce,Ba) is shown in dark grey shaded diamonds. Data for cerium only doped GGAG (Ce) is shown in black squares for comparison.
Figure 9A:
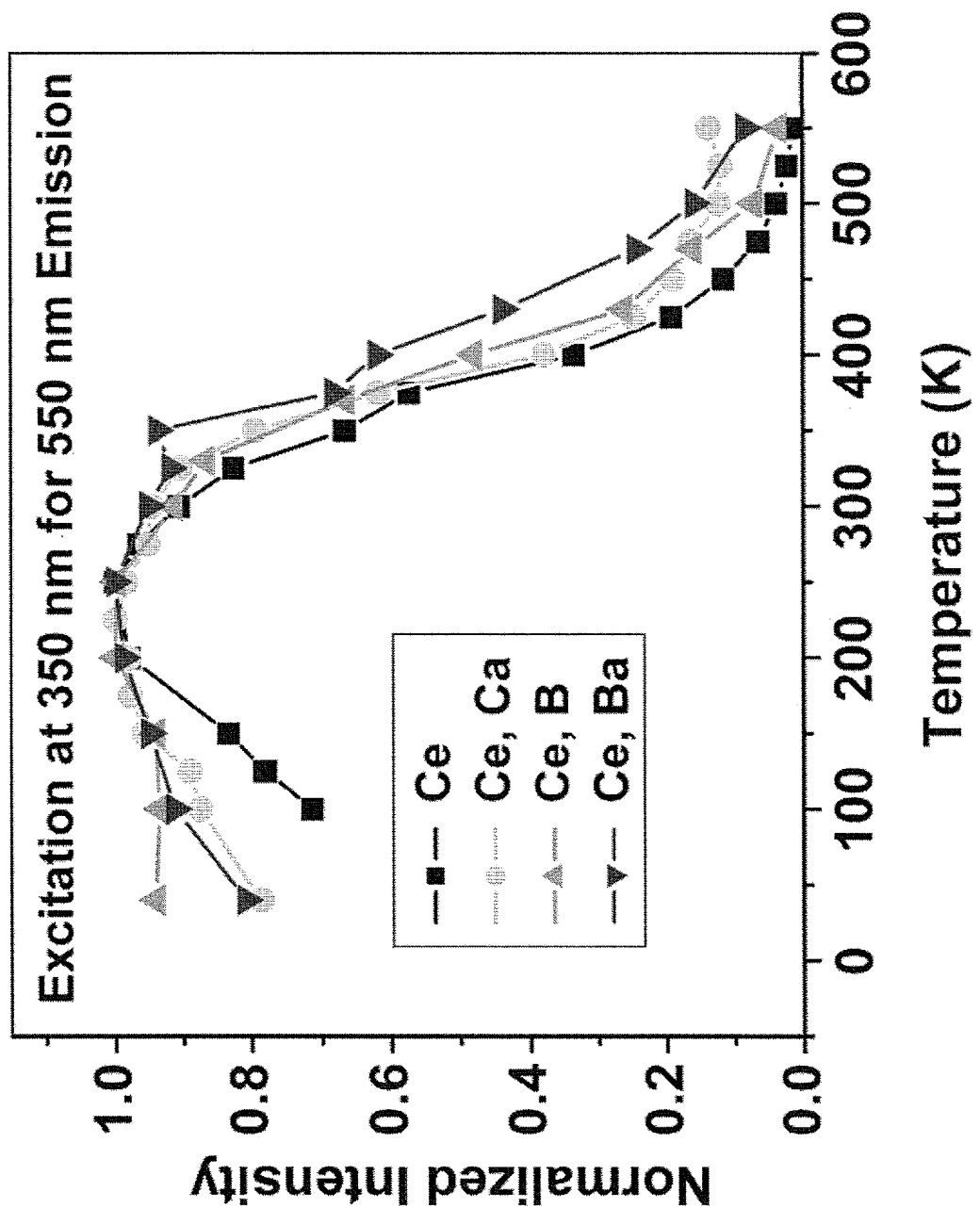
FIG. 9A is a graph showing the temperature dependence of excitation at 350 nm for codoped cerium doped gadolium gallium aluminum garnet (GGAG)-type scintillators (emission at 550 nm). Data for 0.2 atomic % calcium codoped cerium doped GGAG (Ce,Ca) is shown in light grey shaded circles; data for 0.2 atomic % boron codoped cerium doped GGAG (Ce,B) is shown in medium grey shaded triangles, and data for 0.2 atomic % barium codoped cerium doped GGAG (Ce,Ba) is shown in dark grey shaded triangles. Data for cerium only doped GGAG (Ce) is shown in black squares for comparison.
Figure 9B:
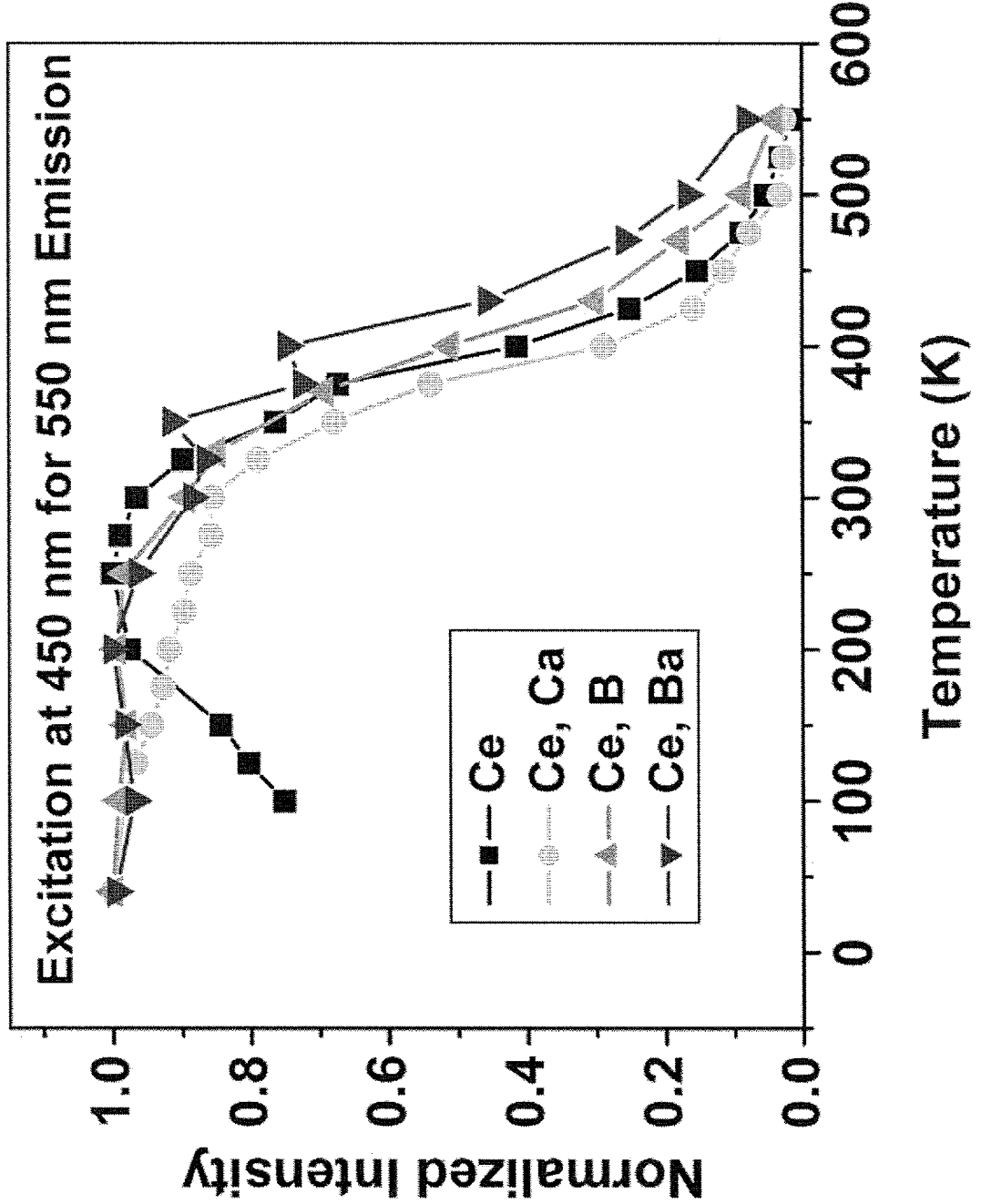
FIG. 9B is a graph showing the temperature dependence of excitation at 450 nm for codoped cerium doped gadolium gallium aluminum garnet (GGAG)-type scintillators (emission at 550 nm). Data for 0.2 atomic % calcium codoped cerium doped GGAG (Ce,Ca) is shown in light grey shaded circles; data for 0.2 atomic % boron codoped cerium doped GGAG (Ce,B) is shown in medium grey shaded triangles, and data for 0.2 atomic % barium codoped cerium doped GGAG (Ce,Ba) is shown in dark grey shaded triangles. Data for cerium only doped GGAG (Ce) is shown in black squares for comparison.
Figure 10:
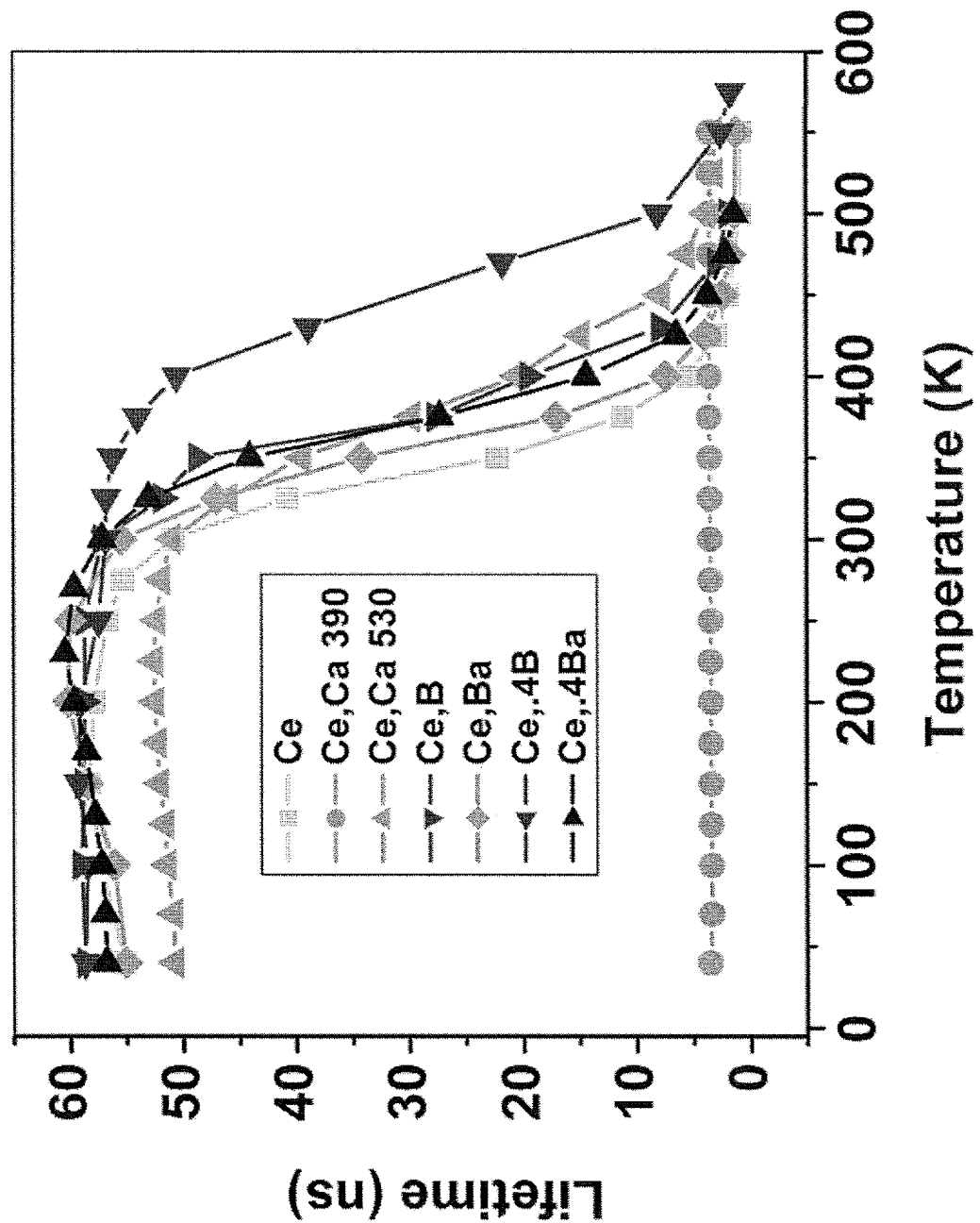
FIG. 10 is a graph showing the temperature dependence of scintillation lifetime (in nanoseconds, ns) for codoped cerium doped gadolium gallium aluminum garnet (GGAG)-type scintillators. Compositions were excited at 350 nm and emission was measured at 390 nm or 530 nm. Data (emission at 390 nm) for 0.2 atomic % calcium codoped cerium doped GGAG (Ce,Ca 390) is shown in medium grey shaded circles. Data (emission at 530 nm) for 0.2 atomic % calcium codoped cerium doped GGAG (Ce,Ca 530) is shown in medium grey shaded, upward pointing triangles; data for 0.2 atomic % boron codoped cerium doped GGAG (Ce,B) is shown in dark grey shaded, downward pointing triangles; data for 0.2 atomic % barium codoped cerium doped GGAG (Ce,Ba) is shown in medium grey shaded diamonds; data for 0.4 atomic % boron codoped cerium doped GGAG (Ce, 0.4B) is shown in dark grey shaded, leftward pointing triangles; and data for 0.4 atomic % barium codoped cerium doped GGAG (Ce,0.4Ba) is shown in the black, rightward pointing triangles. Data for cerium only doped GGAG (Ce) is shown in light grey shaded squares for comparison.
Figure 11A:
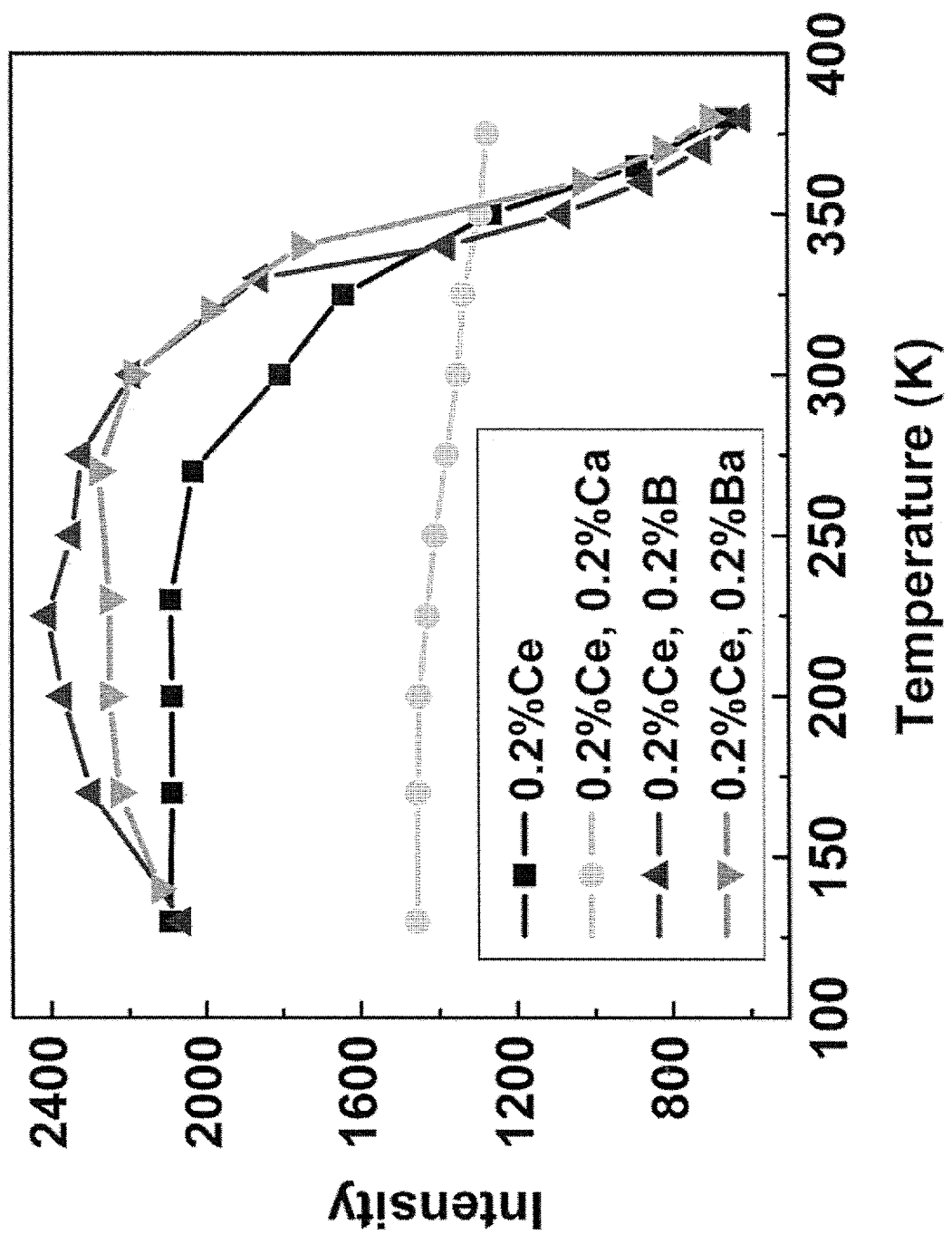
FIG. 11A is a graph showing the temperature dependence of scintillation light yield (LY) for codoped cerium doped gadolium gallium aluminum garnet (GGAG)-type scintillators. Data is shown for 0.2 atomic % calcium codoped 0.2 atomic % cerium doped GGAG (0.2% Ce, 0.2% Ca) in light grey shaded circles; for 0.2 atomic % boron codoped 0.2 atomic % cerium doped GGAG (0.2% Ce, 0.2% B) in dark grey shaded triangles; and for 0.2 atomic % barium codoped 0.2 atomic % cerium doped GGAG (0.2% Ce, 0.2% Ba) in medium grey shaded triangles. For comparison, data for a 0.2 atomic % cerium only doped GGAG (0.2% Ce) is shown in black squares.
Figure 11B:
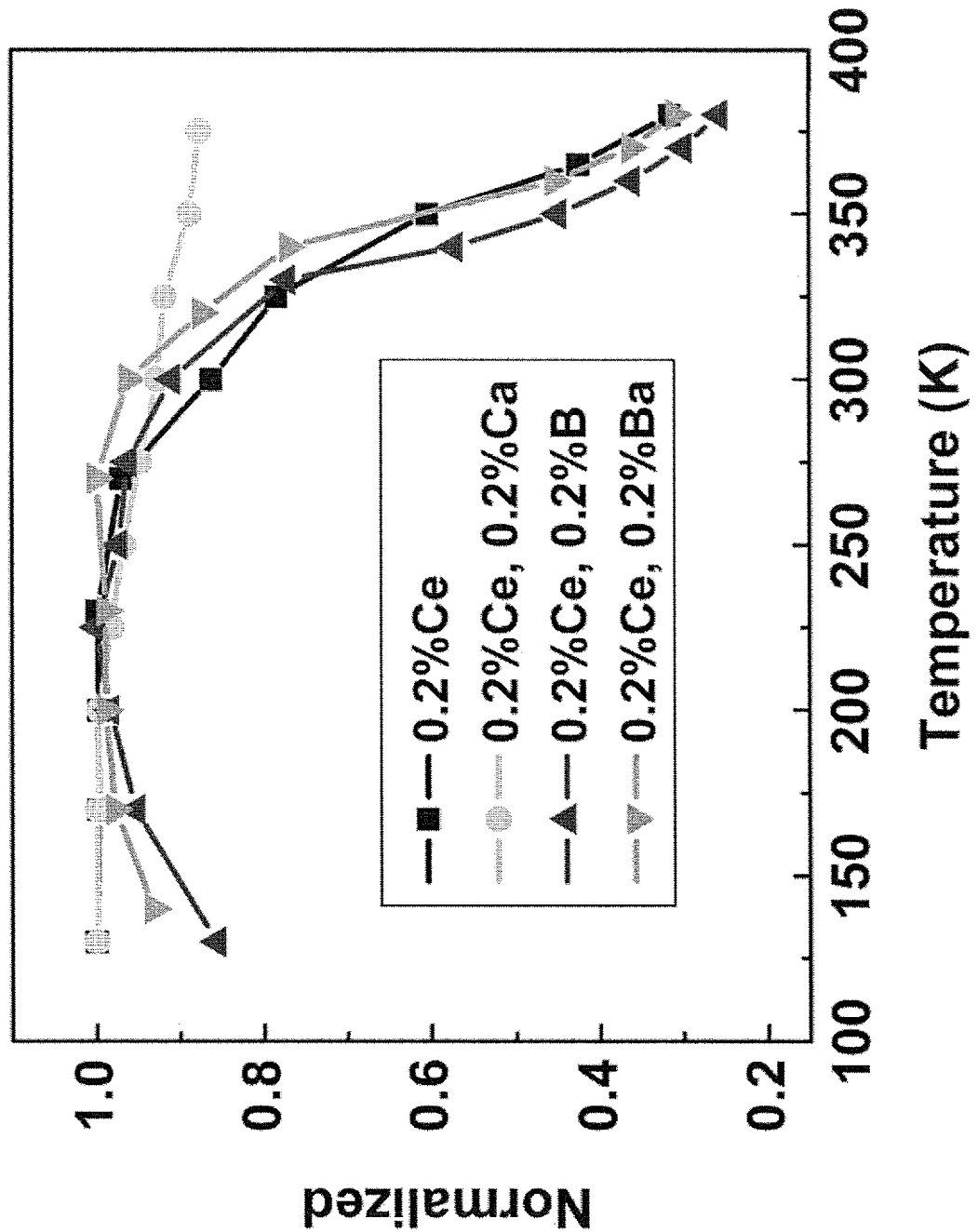
FIG. 11B is a graph showing the temperature dependence of normalized light yield for the scintillators described for FIG. 11B.
Figure 12:
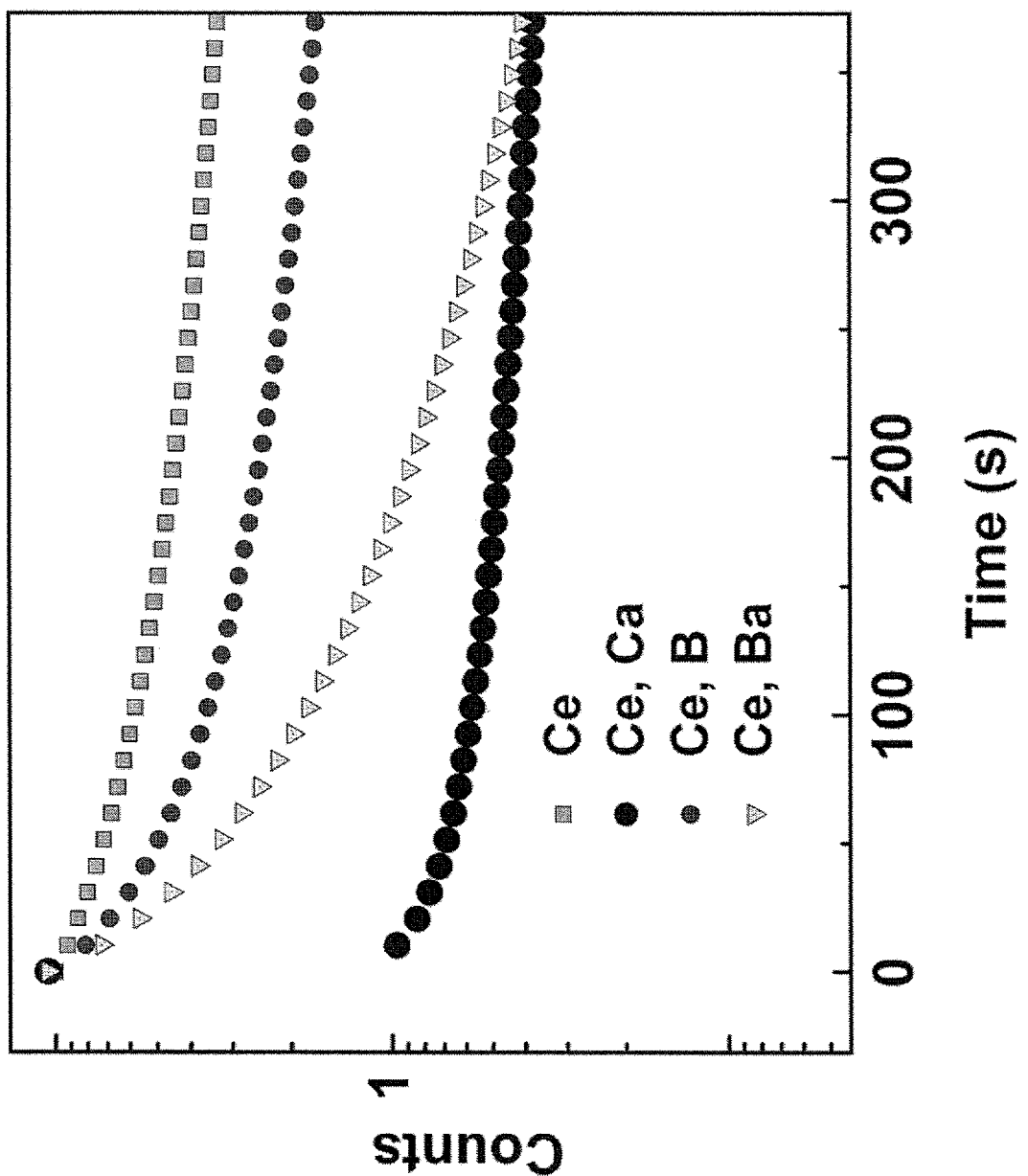
FIG. 12 is a graph showing the afterglow of codoped cerium doped gadolium gallium aluminum garnet (GGAG)-type scintillators. Data is shown for 0.2 atomic % calcium codoped cerium doped GGAG (Ce,Ca) in black circles; while that for 0.2 atomic % boron codoped cerium doped GGAG (Ce,B) is shown in medium grey shaded circles, and that for 0.2 atomic % barium codoped cerium doped GGAG (Ce,Ba) in light grey shaded triangles. For comparison, data for a cerium only doped GGAG (Ce) is shown in medium grey shaded squares.

FIGS. 8A and 8B show the temperature dependence of emission from GGAG codoped scintillators after excitation at 350 nm and 450 nm, respectively. FIGS. 9A and 9B show the temperature dependence of excitation at 350 and 450 nm, respectively. FIG. 10 shows the temperature dependence for the scintillator lifetime. FIGS. 11A and 11B show the temperature dependence of scintillator light yield. FIG. 12 shows the afterglow in the codoped scintillators.

Figure 13:
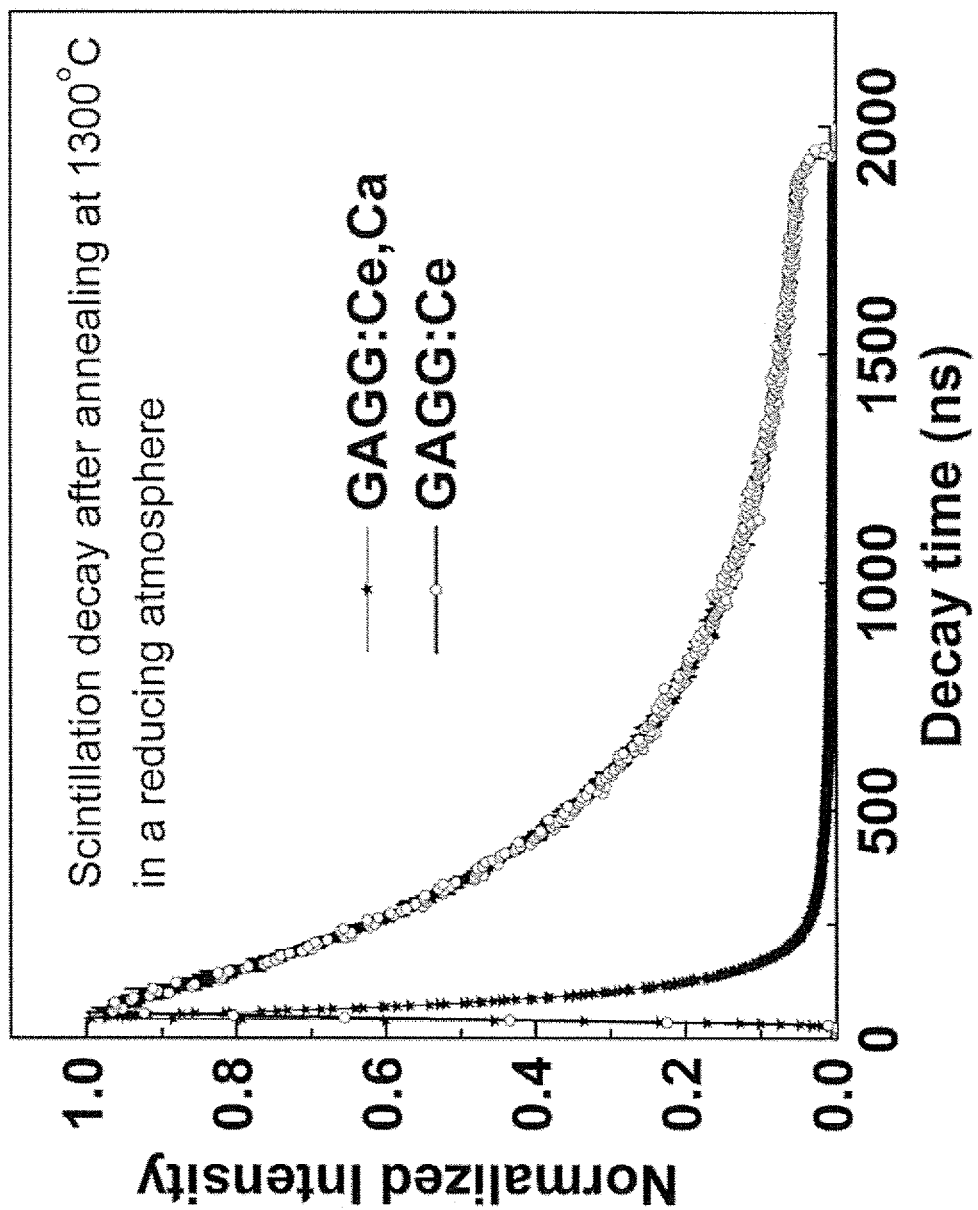
FIG. 13 is a graph showing the effect of annealing in a reducing atmosphere (nitrogen with 2% hydrogen) at 1300 degrees Celsius. Scintillation decay curves are shown for a cerium only doped gadolinium gallium aluminum garnet-type scintillator (GGAG:Ce; open circles) and for a calcium codoped cerium doped gadolinium gallium aluminum garnet-type scintillator (GGAG:Ce,Ca; black stars).

FIG. 13 shows the effect of annealing in nitrogen with 2% $H_2$ at 1300 degrees C. in GGAG:Ce,Ca crystals as compared to a Ce-only doped GGAG crystals. The scintillation decay times for GGAG:Ce and GGAG:Ce,B (not shown) are slower and have stronger afterglow after annealing, while no observable change was detected for the Ca codoped crystals.

In summary, it appears that boron codoping can improve scintillation light output, energy resolution, and proportionality, while calcium codoping has the opposite effects. Without being bound to any one theory, it appears that codoping changes the defect structure of the lattice and not the crystal field around emitting $Ce^{3+}$ dopant ions. It is further believed, again without being bound to any one theory, that codoping with aliovalent $Ca^{2+}$ can favor hole trap centers and the concentration of $Ce^{4+}$ ions, while boron codoping reduces the concentration of electron trap centers.

Example 7

Nb Codoped GGAG:Ce

The effects of niobium (Nb) codoping were studied in a GGAG:Ce,Nb single crystal. The dopant ion concentration was 0.2% and the codopant ion concentration was 0.2%. The top half of the GGAG:Ce,Nb boule was grown in bulk nitrogen with a small fraction of air. The air was turned off during the second half of the growth.

The scintillation light yield, rise and decay times for the GGAG:Ce,Nb crystal were measured and compared to those for Ce-only doped GGAG, and Ca, B, and Ba codoped GGAG. See Table 3, below. Decay and rise times are shown in nanoseconds. The relative percentage of each decay time is indicated in parentheses. The relative light yield for the GGAG:Ce, Nb was measured as 270.

TABLE 3

Light Yield, Decay and Rise Times.

| Composition (size: 5 × 5 × 5 cm³) | LY (Photon/Mev) | Decay Time, $\tau_1$ (R %) | Decay Time, $\tau_2$ (R %) | Rise Time, $\tau_r$ |
| --- | --- | --- | --- | --- |
| GGAG:0.2% Ce | 43,627 | 51 (95.1%) | 381 (4.9%) | 7.8 |
| GGAG:0.2% Ce, 0.2% Ca | 30,875 | 43 (97.5%) | 144 (2.5%) | 4.4 |
| GGAG:0.2% Ce, 0.2% B | 50,313 | 51 (94.3%) | 388 (5.7%) | 8.4 |
| GGAG:0.2% Ce, 0.4% B | 50,375 | 56 (94.1%) | 464 (5.9%) | 7.96 |
| GGAG:0.2% Ce, 0.2% Ba | 49,750 | 57 (92.2%) | 468 (7.8%) | 8.2 |
| GGAG:0.2% Ce, 0.4% Ba | 49,938 | 56 (91.5%) | 438 (8.5%) | n/a |
| GGAG:0.2% Ce, 0.2% Nb | 43,126 | 54 (93.4%) | 458 (6.6%) | 10.6 |

Table 4 provides the calculated $Ce^{3+}$ activation energies for the GGAG codoped materials (at an excitation wavelength of 345 nm and an emission wavelength of 550 nm). Activation energies were calculated from the temperature dependence of photoluminescence intensity (I (T)) and using the Mott-Seitz equation:

$$I=I0/[1+A \exp(-dE/kT)]$$

where dE is the activation energy.

TABLE 4

Calculated $Ce^{3+}$ Activation Energy.

| Composition | Activation Energy (eV) | Thermal quenching temperature |
|---|---|---|
| GGAG:0.2Ce | 0.46195 | ~275 K |
| GGAG:0.2Ce, 0.2Ca | 0.36619 | ~300 K |
| GGAG:0.2Ce, 0.2B | 0.4902 | ~325 K |
| GGAG:0.2Ce, 0.2Ba | 0.65859 | ~375 K |
| GGAG:0.2Ce, 0.4B | 0.84219 | ~425 K |
| GGAG:0.2Ce, 0.4Ba | 0.52434 | ~325 K |
| GGAG:0.2Ce, 0.2NB | 0.4046 | ~300 K |

TL glow curves were used to determine trap parameters for the various codoped materials using the technique described in Yang et al., 2012. For each glow curve peak that occurs at a temperature $T_{max}$, $N_0$ is the trap center population, E is the activation energy, and S is the frequency factor. In addition, the room temperature trap lifetime, $\tau_{298K}$, is calculated. Results are provided in Tables 5-9, below.

TABLE 5

Calculated trap parameters for cerium-only activated GGAG (i.e., GGAG:0.2Ce)

| $T_{max}$ (K) | $N_0$ | E (eV) | ln S ($s^{-1}$) | $\tau_{298\,K}$ (s) |
|---|---|---|---|---|
| 40 | 420 | 0.011 | −1.346 | 5.90E+00 |
| 65 | 53.27 | 0.118 | 18.287 | 1.15E−06 |
| 72 | 503.3 | 0.017 | −2.359 | 2.05E+01 |
| 162 | 21.66 | 0.120 | 2.944 | 5.71E+00 |
| 239 | 9.921 | 0.275 | 8.352 | 1.09E+01 |
| 289 | 43.06 | 0.619 | 20.542 | 3.80E+01 |
| 303 | 20.67 | 0.559 | 16.820 | 1.51E+02 |
| 331 | 12.21 | 0.363 | 7.320 | 9.52E+02 |
| 431 | 1.583 | 0.898 | 19.376 | 6.09E+06 |

TABLE 6

Calculated trap parameters for calcium codoped cerium-activated GGAG (i.e., GGAG:0.2Ce, 0.2Ca)

| $T_{max}$ (K) | $N_0$ | E (eV) | ln S ($s^{-1}$) | $\tau_{298\,K}$ (s) |
|---|---|---|---|---|
| 36 | 0.9419 | 0.01 | −0.623 | 2.754E+00 |
| 62 | 1.1 | 0.128 | 21.121 | 9.974E−08 |
| 389 | 305.8 | 0.962 | 18.467 | 1.118E+07 |

TABLE 7

Calculated trap parameters for boron codoped cerium-activated GGAG (i.e., GGAG:0.2Ce, 0.2B)

| $T_{max}$ (K) | $N_0$ | E (eV) | ln S ($s^{-1}$) | $\tau_{298\,K}$ (s) |
|---|---|---|---|---|
| 55 | 1000 | 0.008 | −3.612 | 5.062E+01 |
| 246 | 3.9 | 0.663 | 25.953 | 9.467E−01 |
| 291 | 26.84 | 0.788 | 24.013 | 8.686E+02 |

TABLE 8

Calculated trap parameters for barium codoped cerium-activated GGAG (i.e., GGAG:0.2Ce, 0.2Ba)

| $T_{max}$ (K) | $N_0$ | E (eV) | ln S ($s^{-1}$) | $\tau_{298\,K}$ (s) |
|---|---|---|---|---|
| 49 | 1060 | 0.008 | −3.072 | 2.950E+01 |
| 100 | 127.1 | 0.045 | 0.314 | 4.236E−01 |
| 196 | 7.432 | 0.139 | 3.172 | 9.562E+02 |
| 274 | 21.62 | 0.385 | 11.443 | 3.644E+01 |
| 334 | 55.11 | 0.481 | 11.773 | 1.114E+03 |
| 383 | 15.14 | 0.446 | 8.090 | 1.128E+04 |
| 482 | 4.317 | 0.846 | 15.289 | 5.149E+07 |

TABLE 9

Calculated trap parameters for niobium codoped cerium-activated GGAG (i.e., GGAG:0.2Ce, 0.2Nb)

| $T_{max}$ (K) | $N_0$ | E (eV) | ln S ($s^{-1}$) | $\tau_{298\,K}$ (s) |
|---|---|---|---|---|
| 46 | 431.6 | 0.007 | −3.297 | 3.553E+01 |
| 101 | 51.38 | 0.042 | 0.019 | 5.062E+00 |
| 185 | 2.882 | 0.152 | 4.566 | 3.941E+00 |
| 265 | 24.84 | 0.362 | 11.038 | 2.224E+01 |
| 311 | 19.64 | 0.376 | 8.859 | 3.398E+02 |
| 335 | 4.736 | 0.287 | 4.059 | 1.274E+03 |
| 495 | 1.253 | 0.952 | 17.292 | 4.339E+07 |

Example 8

Additional Codoping Strategies

Figure 14A:
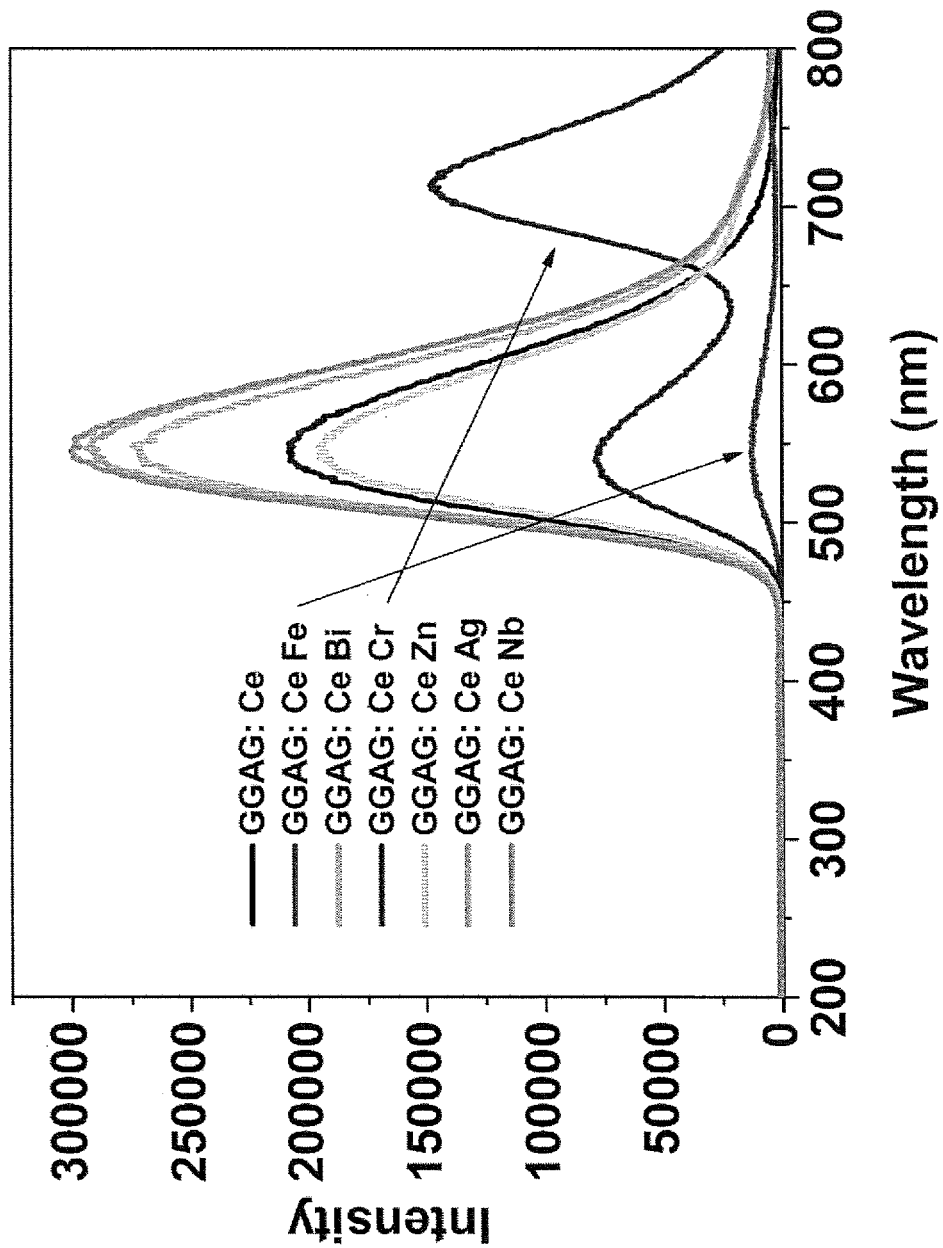
FIG. 14A shows radioluminescence curves for various codoped gadolinium gallium aluminum garnet (GGAG)-type ceramic or polycrystalline pellets prepared via a solid-state reaction and comprising cerium (Ce) as the activator/dopant ion. Codopants include iron (Fe), bismuth (Bi), chromium (Cr), zinc (Zn), silver (Ag) and niobium (Nb).
Figure 14B:
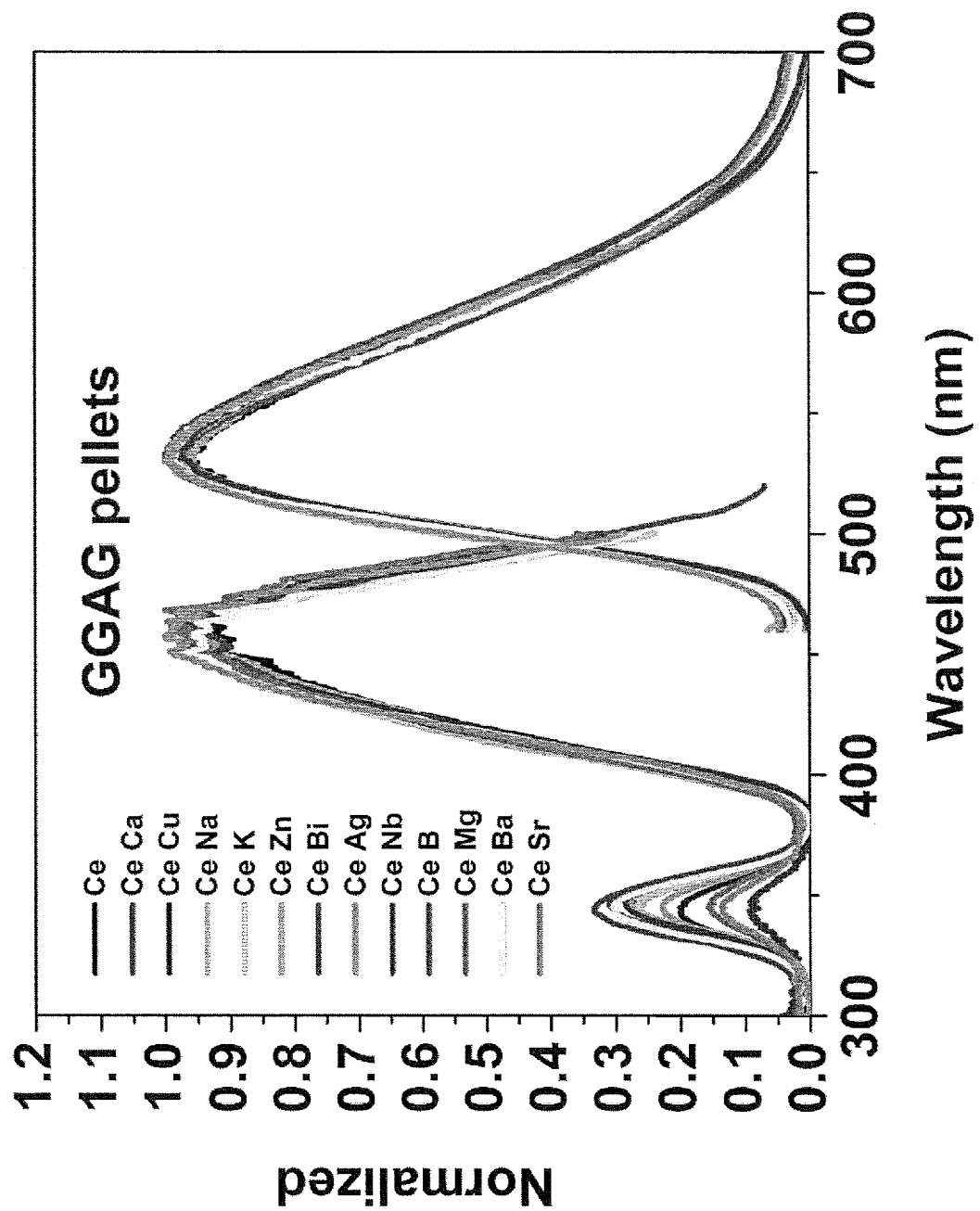
FIG. 14B shows photoluminescence curves for various codoped gadolinium gallium aluminum garnet (GGAG)-type ceramic or polycrystalline pellets prepared via a solid-state reaction and comprising cerium (Ce) as the activator/dopant ion. Codopants include calcium (Ca), copper (Cu), sodium (Na), potassium (K), zinc (Zn), bismuth (Bi), silver (Ag), and niobium (Nb).
Figure 15A:
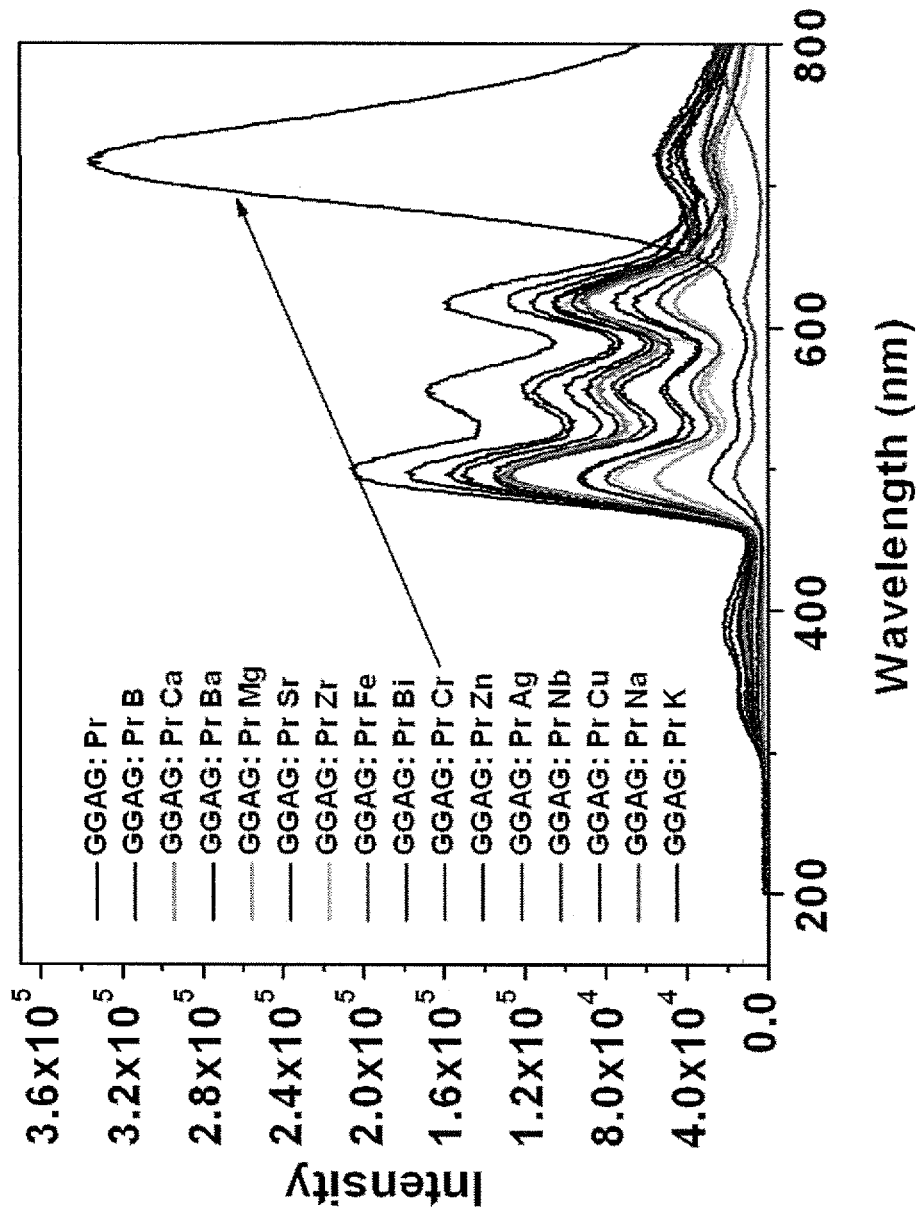
FIG. 15A shows radioluminescence curves for various codoped gadolinium gallium aluminum garnet (GGAG)-type ceramic or polycrystalline pellet scintillators prepared via a solid-state reaction and comprising praseodymium (Pr) the activator/dopant ion. Codopants include boron (B), calcium (Ca), barium (Ba), magnesium (Mg), strontium (Sr), zirconium (Zr), iron (Fe), bismuth (Bi), chromium (Cr), zinc (Zn), silver (Ag), niobium (Nb), copper (Cu), sodium (Na), and potassium (K).
Figure 15B:
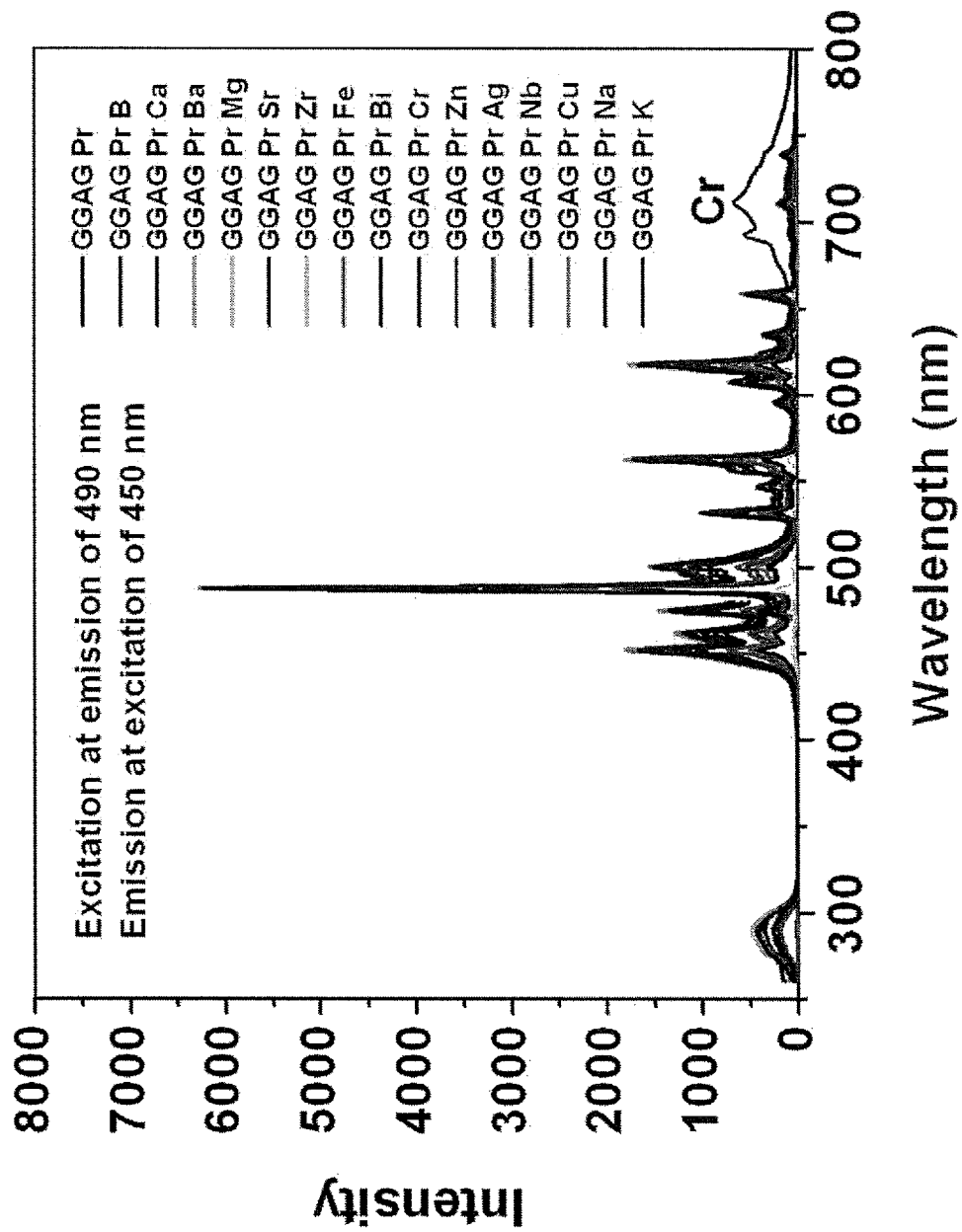
FIG. 15B shows photoluminescence curves for various codoped gadolinium gallium aluminum garnet (GGAG)-type ceramic or polycrystalline pellet scintillators prepared via a solid-state reaction and comprising praseodymium (Pr) the activator/dopant ion. Codopants include boron (B), calcium (Ca), barium (Ba), magnesium (Mg), strontium (Sr), zirconium (Zr), iron (Fe), bismuth (Bi), chromium (Cr), zinc (Zn), silver (Ag), niobium (Nb), copper (Cu), sodium (Na), and potassium (K).

Transparent ceramic or polycrystalline pellets were prepared with the following compositions: GGAG:Ce; GGAG:Ce,Fe; GGAG:Ce,Bi; GGAG:Ce,Cr; GGAG:Ce,Zn; GGAG:Ce,Ag; GGAG:Ce,Nb; GGAG:Ce,Ca; GGAG:Ce,Cu; GGAG:Ce,Na; GGAG:Ce,K; GGAG:Pr; GGAG:Pr,B; GGAG:Pr,Ca; GGAG:Pr,Ba; GGAG:Pr,Mg; GGAG:Pr,Sr; GGAG:Pr,Zr; GGAG:Pr,Fe; GGAG:Pr,Bi; GGAG:Pr,Cr; GGAG:Pr,Zn; GGAG:Pr,Ag; GGAG:Pr,Nb; GGAG:Pr,Cu; GGAG:Pr,Na; and GGAG:Pr,K. Radioluminescence and photoluminescence measurements for some of the codoped GGAG:Ce pellets are shown in FIGS. 14A and 14B, respectively. It can be seen in FIG. 14A that codoping cerium-doped GGAG with chromium (Cr) adds an extra emission peak between about 650 nm and about 800 nm, while codoping with iron (Fe) has the effect of suppressing emission. For the codopants shown in FIG. 14B, it can be seen that the wavelengths of the emission and excitation peaks are largely unchanged, although the intensity of the emission varies in the peak found at about 345 nm. Radioluminescence and photoluminescence measurements for some of the codoped GGAG:Pr pellets are shown in FIGS. 15A and 15B, respectively. In FIGS. 15A and 15B, it can be seen that codoping praseodymium doped GGAG with Cr adds an extra peak.

REFERENCES

The references listed below as well as all references cited in the specification including, but not limited to patents, patent application publications, and journal articles are incorporated herein by reference to the extent that they supplement, explain, provide a background for, or teach methodology, techniques, and/or compositions employed herein.

Cherepy, N. J., et al. (2007) *Nuclear Instruments & Methods in Physics Research Section A: Accelerators Spectrometers Detectors and Associated Equipment*, Vol. 579, No. 1, 38-41.

Cherepy, N. J., et al. (2010) *Proc. SPIE* 7805, 780501.
Donnald, S. B., et al. (2013) *IEEE Transactions on Nuclear Science*, Vol. 60, No. 5, 4002-4006.
Kamada, K., et al. (2011) *Crystal Growth and Design*, Vol. 11, 4484-4490.
Kamada, K., et al. (2012a) *Journal of Crystal Growth*, Vol. 352, No. 1, 88-90.
Kamada, K., et al. (2012b) *Journal of Crystal Growth*, Vol. 352, No. 1, 91-94.
Kang, J.-G., et al., (2008) *Materials Research Bulletin*, Vol. 43, 1982-1988.
PCT International Application Publication No. WO/2007/018345.
Tyagi, M., et al. (2013a) *IEEE Transactions on Nuclear Science*, Vol. PP, Issue 99, 1-4 (Sep. 4, 2013).
Tyagi, M., et al. (2013b) *Journal of Physics D: Applied Physics*, Vol. 46, No. 47, 475302.
U.S. Pat. No. 8,278,624.
U.S. Pat. No. 8,617,422.
Yang et al. (2012) *J. Luminescence*, Vol. 132, 1824-1829.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A scintillator composition comprising:

$$Gd_{3-x-y-z}R_xCe_yE_zAl_{5-s}Ga_sO_{12},$$

wherein
R is Lu or Y;
E is at least one codopant ion;

$0 \leq x \leq 2$;

$0.0001 \leq y \leq 0.15$;

$0.003 \leq z \leq 0.015$; and $1 \leq s \leq 4.0$;

wherein E is a codopant ion selected from the group consisting of $Ca^{2+}$, $B^{3+}$ and a Nb ion, and wherein the scintillator composition is a single crystal scintillator or a ceramic scintillator, wherein y and z are the amount of Ce and codopant ion E relative to the amount of Gd and R in a starting material mixture used to prepare the scintillator composition, and wherein the scintillator composition emits light in response to stimulation by high energy radiation.

2. The scintillator composition of claim 1, wherein the codopant ion is $Ca^{2+}$.

3. The scintillator composition of claim 1, wherein the $Gd_{3-x-y-z}R_xCe_yE_zAl_{5-s}Ga_sO_{12}$ is prepared from a melt.

4. A method of preparing the scintillator composition of claim 1, wherein the method comprises pulling a single crystal from molten raw materials using the Czochralski technique.

5. The scintillator composition of claim 1, wherein y is about 0.006, and wherein z is between about 0.006 and 0.012.

6. The scintillator composition of claim 5, wherein x is 0 and s is 2 or 3.

7. The scintillator composition of claim 1, wherein x is 0, s is 2 or 3, y is about 0.006 and z is about 0.006.

8. A device comprising a photodetector and a composition comprising a scintillator material that emits light in response to stimulation by high energy radiation, said scintillator material comprising:

$$Gd_{3-x-y-z}R_xCe_yE_zAl_{5-s}Ga_sO_{12},$$

wherein
R is Lu or Y;
E is at least one codopant ion;
$0 \leq x \leq 2$;
$0.0001 \leq y \leq 0.15$;
$0.003 \leq z \leq 0.015$; and
$1 \leq s \leq 4.0$;
wherein E is a codopant ion selected from the group consisting of $Ca^{2+}$, $B^{3+}$ and a Nb ion and wherein y and z are the amount of Ce and codopant ion E relative to the amount of Gd and R in a starting material mixture used to prepare the scintillator.

9. The device of claim 8, adapted for use in medical imaging, geological exploration, or homeland security.

10. The device of claim 8, wherein the scintillator material is a single crystal scintillator or a ceramic scintillator.

11. The device of claim 8, wherein x is 0, s is 2 or 3, y is between about 0.003 and about 0.015, z is between about 0.006 and about 0.012, and wherein the codopant ion is selected from the group consisting of $Ca^{2+}$ and $B^{3+}$.

12. A method of detecting high energy photons and particles, the method comprising providing a device comprising a photodetector and a composition comprising a scintillator material that emits light in response to stimulation by high energy radiation, said scintillator material comprising:

$$Gd_{3-x-y-z}R_xCe_yE_zAl_{5-s}Ga_sO_{12},$$

wherein
R is Lu or Y;
E is at least one codopant ion;
$0 \leq x \leq 2$;
$0.0001 \leq y \leq 0.15$;
$0.003 \leq z \leq 0.015$; and
$1 \leq s \leq 4.0$;
wherein E is a codopant ion selected from the group consisting of $Ca^{2+}$, $B^{3+}$ and a Nb ion and wherein y and z are an amount of Ce and codopant ion E relative to the amount of Gd and R in the starting material mixture used to prepare the scintillator; and detecting high energy photons and particles with the device.

13. The device of claim 12, wherein the scintillator material is a single crystal scintillator or a ceramic scintillator.

14. The method of claim 12, wherein x is 0, s is 2 or 3, y is between about 0.003 and about 0.015, z is between about 0.006 and about 0.012, and wherein the codopant ion is selected from the group consisting of $Ca^{2+}$ and $B^{3+}$.

15. A method of altering one or more scintillation properties of a cerium doped gadolinium gallium aluminum garnet-type scintillator material, the method comprising preparing a codoped scintillator material that emits light in response to stimulation by high energy radiation, said codoped scintillator material comprising:

$$Gd_{3-x-y-z}R_xCe_yE_zAl_{5-s}Ga_sO_{12},$$

wherein
R is Lu or Y;
E is at least one codopant ion;
$0 \leq x \leq 2$;
$0.0001 \leq y \leq 0.15$;
$0.003 \leq z \leq 0.015$; and
$1 \leq s \leq 4.0$;
wherein E is selected from the group consisting of $Ca^{2+}$, $B^{3+}$ and a Nb ion and wherein y and z are the amount of Ce and codopant ion E relative to the amount of Gd and R in a starting material mixture used to prepare the scintillator, thereby providing a codoped scintillator material that emits light when stimulated by high energy radiation, wherein the codoped scintillator material is a single crystal or a ceramic and wherein the altering provides a codoped scintillator material that exhibits one or more of faster decay, better energy resolution, increased light yield, longer decay time, shorter rise time, better proportionality, and reduced light sensitivity in response to said high energy radiation compared to a corresponding non-codoped scintillator.

16. The method of claim 15, wherein the codoped scintillator material comprises a single crystal and the method comprises:
    (a) forming a melt for the growth of the cerium doped scintillator material,
    (b) adding a co-dopant to the melt; and
    (c) pulling a crystal from said melt.

17. The method of claim 16, wherein the method further comprises annealing the codoped scintillator material.

18. The method of claim 17, wherein the annealing is performed in air, nitrogen, or a mixture of nitrogen and hydrogen.

19. The method of claim 15, wherein the codopant ion is $Ca^{2+}$, and the method provides a codoped scintillator that exhibits one or more of faster decay, shorter rise time, or reduced light sensitivity in response to stimulation by high energy radiation as compared to a corresponding non-codoped scintillator.

20. The method of claim 15, wherein the codopant ion is $B^{3+}$, and the method provides a codoped scintillator that exhibits one or more of better energy resolution, increased light yield, longer decay time, shorter rise time, better proportionality, and reduced light sensitivity in response to stimulation by high energy radiation compared to a corresponding non-codoped scintillator.

21. A scintillator composition comprising a gadolinium gallium aluminum garnet (GGAG) doped with about 0.2 atomic % cerium (Ce) and codoped with about 0.2 atomic % to about 0.4 atomic % boron (B), wherein amounts of Ce and B are amounts provided relative to an amount of gadolinium (Gd) in a starting material mixture used to prepare the scintillator composition, and wherein said scintillator composition exhibits greater scintillation light output and improved energy resolution compared to GGAG doped with 0.2 atomic % Ce and not codoped with B.

22. The scintillator composition of claim 21, wherein said scintillator composition has an energy resolution of 7.8%.

23. A scintillator composition comprising a gadolinium gallium aluminum garnet (GGAG) doped with about 0.2 atomic % cerium (Ce) and codoped with about 0.2 atomic % calcium (Ca), wherein amounts of Ce and Ca are amounts provided relative to an amount of gadolinium (Gd) in a starting material mixture used to prepare the scintillator composition, and wherein said scintillator composition exhibits temperature independent scintillation light yield, decay time and rise time.

* * * * *